United States Patent
Rafi et al.

(10) Patent No.: US 11,316,522 B2
(45) Date of Patent: Apr. 26, 2022

(54) CORRECTION FOR PERIOD ERROR IN A REFERENCE CLOCK SIGNAL

(71) Applicant: Silicon Laboratories Inc., Austin, TX (US)

(72) Inventors: Aslamali A. Rafi, Austin, TX (US); Timothy A. Monk, Hudson, NH (US); William Anker, Londonderry, NH (US); Srisai Rao Seethamraju, Nashua, NH (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 16/901,814

(22) Filed: Jun. 15, 2020

(65) Prior Publication Data

US 2021/0391864 A1  Dec. 16, 2021

(51) Int. Cl.
  *H03L 7/099* (2006.01)
  *H03L 7/08* (2006.01)
  *H03L 7/197* (2006.01)
  *H03L 7/14* (2006.01)

(52) U.S. Cl.
  CPC .......... *H03L 7/0807* (2013.01); *H03L 7/0992* (2013.01); *H03L 7/143* (2013.01); *H03L 7/1974* (2013.01)

(58) Field of Classification Search
  CPC .......... H03B 28/00; H03D 3/24; H03K 5/156; H03L 7/00; H03L 7/06; H03L 7/08; H03L 7/23; H03L 7/089; H03L 7/091; H03L 7/093; H03L 7/099; H03L 7/143; H03L 7/235; H03L 7/0807; H03L 7/0992; H03L 7/1974; H03M 1/48; H04L 7/033; H04L 7/0331

USPC .............. 327/107, 111, 147–149, 156–158; 331/16–17, 44; 375/354, 375–376

See application file for complete search history.

(56) References Cited

U.S. PATENT DOCUMENTS

| | | |
|---|---|---|
| 3,508,195 A | 4/1970 | Sellers |
| 4,301,466 A | 11/1981 | Lemoine et al. |
| 5,467,373 A | 11/1995 | Ketterling |
| 5,576,666 A | 11/1996 | Rauvola |
| 6,515,525 B2 | 2/2003 | Hasegawa |
| 6,829,318 B2 | 12/2004 | Kawahara |
| 7,061,276 B2 | 6/2006 | Xu |

(Continued)

OTHER PUBLICATIONS

Avivi, R., et al., "Adaptive Spur Cancellation Technique in All-Digital Phase-Locked Loops," IEEE Transactions on Circuits and Systems-II: Express Briefs, vol. 64, No. 11, Nov. 2017, pp. 1292-1996.

(Continued)

*Primary Examiner* — Shawkat M Ali
(74) *Attorney, Agent, or Firm* — Zagorin Cave LLP

(57) ABSTRACT

A phase and frequency detector receives a reference clock signal with a period error and receives a feedback clock signal from a feedback divider. The feedback divider circuit divides a clock signal from a voltage controlled oscillator. The feedback divider divides by different divide values during odd and even cycles of the reference clock signal to cause the feedback clock signal to have a period error that substantially matches the period error of the reference clock signal. The divider values supplied to the feedback divider are determined, at least in part, by the period error of the reference clock signal.

21 Claims, 16 Drawing Sheets

(56) References Cited

U.S. PATENT DOCUMENTS

| | | |
|---|---|---|
| 7,064,616 B2 | 6/2006 | Reichert |
| 7,208,990 B1 | 4/2007 | Hassun |
| 7,391,839 B2 | 6/2008 | Thompson |
| 7,545,190 B2 | 6/2009 | Chiang et al. |
| 7,605,662 B2 | 10/2009 | Kobayashi et al. |
| 7,746,972 B1 | 6/2010 | Melanson et al. |
| 7,888,973 B1 | 2/2011 | Rezzi |
| 8,207,766 B2 | 6/2012 | Yu |
| 8,242,849 B1* | 8/2012 | Seethamraju ............. H03L 1/00 331/44 |
| 8,390,348 B2 | 3/2013 | Burcea |
| 8,427,243 B2 | 4/2013 | Chen et al. |
| 8,497,716 B2 | 7/2013 | Zhang |
| 8,604,840 B2 | 12/2013 | Ahmadi et al. |
| 8,947,139 B1 | 2/2015 | Vercesi et al. |
| 8,957,712 B2 | 2/2015 | Tang et al. |
| 9,065,457 B2 | 6/2015 | NamdarMehdiabadi |
| 9,071,195 B2 | 6/2015 | Gabbay |
| 9,207,646 B2 | 12/2015 | Wang |
| 9,219,484 B2* | 12/2015 | Yao ............................ H03L 7/06 |
| 9,246,500 B2 | 1/2016 | Perrott |
| 9,490,818 B2 | 11/2016 | Perrott |
| 9,634,678 B1 | 4/2017 | Caffee et al. |
| 9,705,514 B2* | 7/2017 | Perrott ..................... H03L 7/093 |
| 9,762,250 B2 | 9/2017 | Perrott |
| 9,923,563 B1 | 3/2018 | Horovilz et al. |
| 10,581,418 B2 | 3/2020 | Wu et al. |
| 10,594,329 B1 | 3/2020 | Elkholy |
| 10,840,897 B1 | 11/2020 | Rafi |
| 2002/0000800 A1 | 1/2002 | Hill |
| 2002/0097826 A1 | 7/2002 | Iwata et al. |
| 2003/0112045 A1 | 6/2003 | Atallah et al. |
| 2007/0090866 A1 | 4/2007 | Park et al. |
| 2008/0061850 A1 | 3/2008 | Watanabe |
| 2008/0116946 A1 | 5/2008 | Masson |
| 2008/0129352 A1 | 6/2008 | Zhang |
| 2008/0218228 A1 | 9/2008 | Masson |
| 2009/0132884 A1 | 5/2009 | Suda et al. |
| 2009/0251225 A1 | 10/2009 | Chen et al. |
| 2010/0061499 A1 | 3/2010 | Mijuskovik |
| 2010/0097150 A1 | 4/2010 | Ueda et al. |
| 2010/0164579 A1 | 7/2010 | Acatrinel |
| 2010/0213984 A1 | 8/2010 | Shin et al. |
| 2010/0264963 A1 | 10/2010 | Kikuchi et al. |
| 2011/0025388 A1 | 2/2011 | Lamanna |
| 2011/0074479 A1 | 3/2011 | Yun et al. |
| 2011/0109354 A1 | 5/2011 | Feng et al. |
| 2011/0109356 A1 | 5/2011 | Ali et al. |
| 2011/0133799 A1 | 6/2011 | Dunworth et al. |
| 2011/0204938 A1 | 8/2011 | Lamanna |
| 2011/0204948 A1 | 8/2011 | Satoh et al. |
| 2011/0227612 A1 | 9/2011 | Chiesa |
| 2011/0234272 A1* | 9/2011 | Yu ............................ H03L 7/089 327/157 |
| 2012/0153999 A1 | 6/2012 | Kim |
| 2012/0161832 A1 | 6/2012 | Lee et al. |
| 2013/0050013 A1 | 2/2013 | Kobayashi et al. |
| 2013/0112472 A1 | 5/2013 | Welland |
| 2013/0222026 A1 | 8/2013 | Havens |
| 2013/0257494 A1 | 10/2013 | Nikaeen et al. |
| 2013/0271186 A1* | 10/2013 | Hossain .................. H03L 7/081 327/107 |
| 2014/0038534 A1 | 2/2014 | Ciacci et al. |
| 2014/0077849 A1 | 3/2014 | Chen et al. |
| 2014/0211899 A1 | 7/2014 | Furudate |
| 2014/0218094 A1 | 8/2014 | Oppelt |
| 2014/0266341 A1 | 9/2014 | Jang et al. |
| 2014/0268936 A1 | 9/2014 | Lu et al. |
| 2015/0008961 A1 | 1/2015 | Kim et al. |
| 2015/0145567 A1 | 5/2015 | Perrott |
| 2015/0145571 A1 | 5/2015 | Perrott |
| 2015/0207514 A1 | 7/2015 | Kim et al. |
| 2016/0112053 A1 | 4/2016 | Perrott |
| 2016/0359493 A1 | 12/2016 | Chen et al. |
| 2017/0005786 A1* | 1/2017 | Perdoor .................. H03L 7/183 |
| 2017/0093412 A1* | 3/2017 | Van Brunt ............. H03L 7/1976 |
| 2018/0367614 A1 | 12/2018 | Millar |
| 2019/0068205 A1 | 2/2019 | Tamura et al. |

OTHER PUBLICATIONS

Ho, C., and Chen, M., "A Fractional-N DPLL With Calibration-Free Multi-Phase Injection-Locked TDC and Adaptive Single-Tone Spur Cancellation Scheme," IEEE Transactions on Circuits and Systems-I: Regular Papers, vol. 63, No. 8, Aug. 2016, pp. 1111-1122.

Gupta, M. and Song, B.S., "A 1.8GHz Spur Cancelled Fractional-N Frequency Synthesizer with LMS Based DAC Gain Calibration," IEEE International Solid-State Circuits Conference, vol. 41, No. 12, Dec. 2006, pp. 2842-2851.

Hedayati, H. et al., "A 1 MHz Bandwidth, 6 GHz 0.18 μm CMOS Type-I ΔΣ Franctional-N Synthesizer for WiMAX Applications," IEEE Journal of Solid State Circuits, vol. 44, No. 12, Dec. 2009, pp. 3244-3252.

Hedayati, H. and Bakkaloslu, B., "A 3GHz Wideband ΣΔ Fractional-N Synthesizer with Voltage-Mode Exponential CP-PFD", IEEE Radio Frequency Integrated Circuits Symposium, 2009, pp. 325-328.

Hsu, C.M. et al., "A Low-Noise Wide-BW 3.6-GHz Digital ΔΣ Fractional-N Frequency Synthesizer with a Noise-Shaping Time-to-Digital Converter and quantization Noise Cancellation," IEEE Journal of Solid-State Circuits, vol. 43, No. 12, Dec. 2008, pp. 2776-2786.

Li, Y., et al., "On-Chip Spur and Phase Noise Cancellation Techniques," IEEE Asian Solid-State Circuits Conference, Nov. 6-8, 2017, pp. 109-112.

Menninger, S. and Perrott, M., "A 1-MHz Bandwidth 3.6-GHz 0.18μm CMOS Fractional-N Synthesizer Utilizing a Hybrid PFD/DAC Structure for Reduced Broadband Phase Noise," IEEE Journal of Solid-State Circuits, vol. 41, No. 4, Apr. 2006, pp. 966-980.

Pamarti et al., "A wideband 2.4GHz Delta-Sigma Fractional-N PLL with 1 Mb/s In-Loop Modulation," IEEE Journal of Solid-State Circuits, vol. 39, No. 1, Jan. 2004, pp. 49-62.

Staszewski, R.B. et al., "All-Digital PLL and Transmitter for Mobile Phones," IEEE Journal of Solid-State Circuits, vol. 40, No. 12, Dec. 2005, pp. 2469-2482.

Staszewski, R.B. et al., "1.3 V, 20 ps Time-to-Digital Converter for Frequency Synthesis in 90-nm CMOS," IEEE Transactions on Circuits and Systems-II, Express Briefs, vol. 53, No. 3, Mar. 2006, pp. 220-224.

Straayer, M.Z. and Perrott, M.H., A 12-Bit, 10-MHz Bandwidth, Continuous-Time ΣΔADC With a 5-Bit, 950-MS/s VCO-Based Quantizer, IEEE Journal of Solid-State Circuits, vol. 43, No. 4, Apr. 2008, pp. 805-814.

Swaminathan et al., "A Wide-Bandwidth 2.4 GHz ISM Band Fractional-N PLL with Adaptive Phase Noise Cancellation", IEEE Journal of Solid-State Circuits, vol. 42, No. 12, Dec. 2007, pp. 2639-2650.

Temporiti, E. et al., "A 700kHz Bandwith ΣΔ Fractional Synthesizer with Spurs Compensation and Linearization Techniques for WCDMA Applications," IEEE Journal of Solid-State Circuits, vol. 39, No. 9, Sep. 2004, pp. 1446-1454.

U.S. Appl. No. 16/593,473, entitled "Spur Cancellation in a PLL System with an Automatically Updated Target Spur Frequency," filed Oct. 4, 2019, by Timothy A. Monk and Douglas F. Pastorello.

U.S. Appl. No. 16/018,598, entitled "Spur Cancellation for Spur Measurement," filed Jun. 26, 2018, by Timothy A. Monk and Rajesh Thirugnanam.

U.S. Appl. No. 16/143,717, entitled "Spur Cancellation with Adaptive Frequency Tracking," filed Sep. 27, 2018, by Timothy A. Monk and Rajesh Thirugnanam.

U.S. Appl. No. 16/143,711, entitled "Spur Canceller with Multiplier-Less Correlator," filed Sep. 27, 2018, by Timothy A. Monk and Rajesh Thirugnanam.

U.S. Appl. No. 16/805,336, entitled "Spur and Quantization Noise Cancellation for PLLS with Non-Linear Phase Detection," filed Feb. 28, 2020, by Aslamali A. Rafi et al.

(56) References Cited

OTHER PUBLICATIONS

U.S. Appl. No. 16/670,874, entitled "Noise Canceling Technique for a Sine to Square Wave Converter," filed Oct. 31, 2019, by Aslamali A. Rafi et al.
Wikipedia, "Phase-Locked Loop," https://en.wikipedia.org/wiki/Phase-locked_loop, downloaded Dec. 14, 2015, 17 pages.
IDT, "I2C Programmable Ethernet Clock Generator," 8T49N4811 Data Sheet, Revision A, Mar. 30, 2015, pp. 1-34.
Inti, R. et al., "A 0.5-to-2.5 Gb/s Reference-Less Half-Rate Digital CDR with Unlimited Frequency Acquisition Range and Improved Input Duty-Cycle Error Tolerance," IEEE Journal of Solid-State Circuits, vol. 46, No. 12, Dec. 2011, pp. 3150-3162.
Ma, S., "Feasibility Study of Frequency Doubling Using an AN XOR-Gate Method," MSc. Thesis, Jan. 2013, pp. 1-77.
Oortgiesen, R., "Feasibility Study of Frequency Doubling Using a Dual-Edge Method," MSc. Thesis, Nov. 2010, pp. 1-56.
Razavi, B., "RF Microelectronics," Second Editioin, Prentice Hall, 2012, pp. 664-667.

* cited by examiner

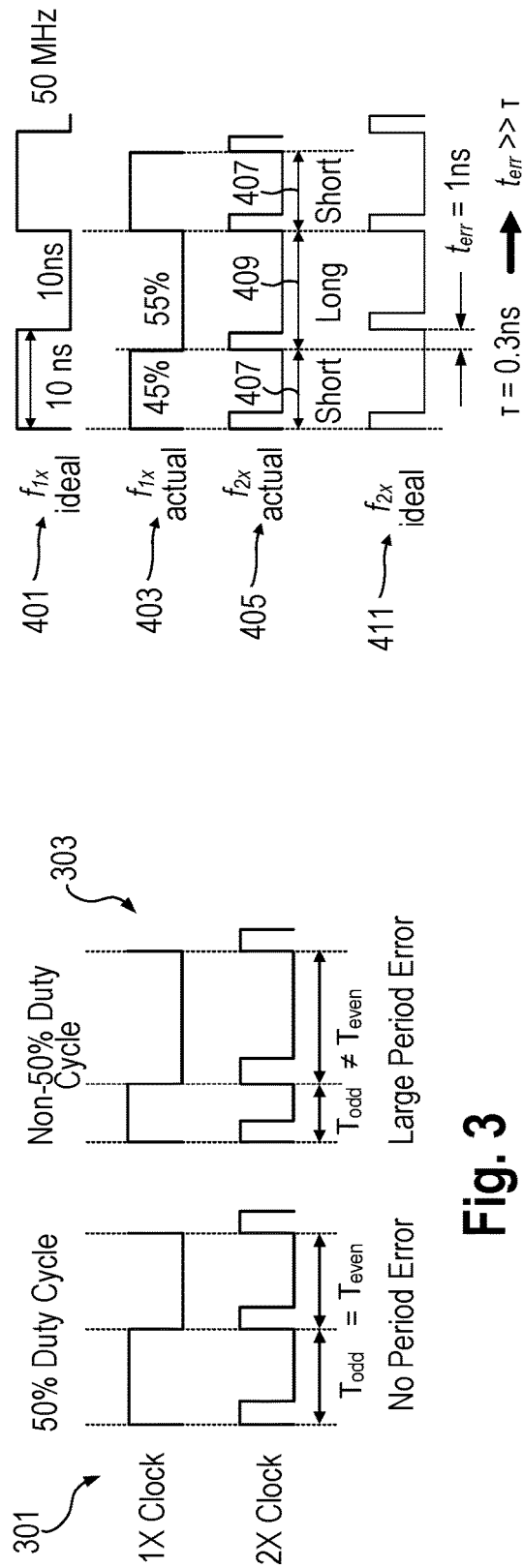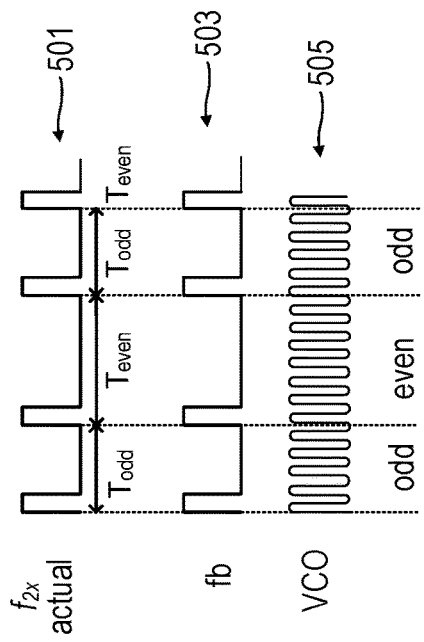
Fig. 3
Fig. 4
Fig. 5

$$C_{xx} = I + L + U$$
$$C_{xx}\Delta h = (I + L + U)h = C_{ex}$$
$$\boxed{\Delta h^{m+1} = C_{ex} - L\Delta h^{m+1} - U\Delta h^{m}}$$

$$c_{ex} = \begin{bmatrix} \overline{x_1}^T \cdot \overline{e} \\ \overline{x_2}^T \cdot \overline{e} \\ \overline{x_3}^T \cdot \overline{e} \\ \overline{x_4}^T \cdot \overline{e} \\ \overline{x_5}^T \cdot \overline{e} \end{bmatrix} = \begin{bmatrix} \overline{x_1}^T \cdot \overline{x_1} & \overline{x_1}^T \cdot \overline{x_2} & \cdots & \overline{x_1}^T \cdot \overline{x_5} \\ \overline{x_2}^T \cdot \overline{x_1} & \overline{x_2}^T \cdot \overline{x_2} & \cdots & \overline{x_2}^T \cdot \overline{x_5} \\ \vdots & \vdots & & \vdots \\ \overline{x_5}^T \cdot \overline{x_1} & \overline{x_5}^T \cdot \overline{x_2} & \cdots & \overline{x_5}^T \cdot \overline{x_5} \end{bmatrix} \begin{bmatrix} h_1 \\ h_2 \\ h_3 \\ h_4 \\ h_5 \end{bmatrix}$$

Cross-correlation vector    Covariance matrix    Optimal $h$ $$c_{ex} = C_{xx} h \implies h = C_{xx}^{-1} c_{ex}$$

CORRECTION FOR PERIOD ERROR IN A REFERENCE CLOCK SIGNAL

BACKGROUND

Field of the Invention

This disclosure relates to addressing period error present in reference clock signals for a frequency synthesizer.

Description of the Related Art

Certain types of oscillators that are widely used in electronic communication systems naturally generate sine waves. In wireless, wired, and optical communication links, such oscillators set the time reference for the system. A frequency synthesizer following the oscillator generates the clock or a local oscillator signal of a specific and different frequency for use in the communication link. The frequency synthesizer prefers a rectangular wave with sharp edges as its reference clock input so as to be less susceptible to other noise sources in the synthesizer circuit. Hence, a sine-to-rectangular wave converter is frequently used between the oscillator circuit and the synthesizer. However, the oscillator output is corrupted by low frequency additive noise, which might be a result of the biasing circuitry used in the oscillator or the sine-to-square wave converter. On passing through the sine-to-square wave converter, this low frequency additive noise, which can be significant, gets converted to phase noise as the edges of the rectangular wave get modulated by the additive noise. This noise also appears at the output of the frequency synthesizer and affects the phase noise performance of the clock or the local oscillator signal, ultimately affecting the performance of the data communication link.

Referring to FIG. 1, the effect of this additive noise is shown as the "hump" 101 in the phase noise profile of an example frequency synthesizer. Better ways to address noise would be desirable to improve the performance of frequency synthesizers and ultimately to improve the performance of data communication links.

SUMMARY OF EMBODIMENTS OF THE INVENTION

Accordingly, in one embodiment a method includes supplying a reference clock signal with a period error and a feedback clock signal to a phase and frequency detector of a phase-locked loop. The method further includes dividing a clock signal supplied to a feedback divider of the phase-locked loop by at least a first divide value during an odd cycle of the reference clock signal and by at least a second divide value during an even cycle of the reference clock signal to thereby generate a feedback divider signal. The first divide value and the second divide value are based, at least in part, on an error term corresponding to the period error. A value of the error term is determined using a covariance matrix. The feedback clock signal is generated using the feedback divider signal and has a feedback period error substantially equal to the period error of the reference clock signal.

In another embodiment an apparatus includes a phase-locked loop, which has a phase and frequency detector coupled to receive a reference clock signal with a period error and coupled to receive a feedback clock signal. The phase and frequency detector supplies a signal indicative of a difference between the reference clock signal and the feedback clock signal. A feedback divider divides a clock signal that is coupled to an oscillator of the phase-locked loop and supplies a feedback divider signal. The feedback divider signal is used to generate the feedback clock signal supplied to the phase and frequency detector. The feedback divider coupled to receive at least a first divide value to divide the clock signal during an odd cycle of the reference clock signal and to receive at least a second divide value to divide the clock signal during an even cycle of the reference clock signal. The first divide value and the second divide value are based, at least in part, on an error term indicative of the period error of the reference clock signal. An adaptation engine is configured to generate the error term utilizing a covariance matrix. The feedback clock signal has a feedback clock period error substantially equal to the period error of the reference clock signal as a result, at least in part, of dividing the clock signal by the first divide value during the odd cycle and by dividing the clock signal by the second divide value during the even cycle.

In another embodiment a phase-locked loop includes a phase and frequency detector coupled to receive a reference clock signal with a period error and coupled to receive a feedback clock signal. The phase and frequency detector supplies a signal indicative of a difference between the reference clock signal and the feedback clock signal. A feedback divider circuit divides a clock signal that is coupled to an oscillator and provides a feedback divider signal. A feedback divider control circuit supplies the feedback divider circuit at least a first divide value during an odd cycle of the reference clock signal and at least a second divide value during an even cycle of the reference clock signal to thereby provide the feedback divider signal. The first divide value and the second divide value are based, at least in part, on an error term indicative of the period error. The feedback divider control circuit including delta sigma modulator is coupled to supply divide values to the feedback divider circuit during odd cycles and even cycles to thereby achieve a fractional divide value of the clock signal. The feedback clock signal is based on the feedback divider signal and has a feedback period error substantially equal to the period error of the reference clock signal.

BRIEF DESCRIPTION OF THE DRAWINGS

The present invention may be better understood, and its numerous objects, features, and advantages made apparent to those skilled in the art by referencing the accompanying drawings.

FIG. 3 illustrates the period error in the 2× reference clock signal caused by the reference oscillator signal having a duty cycle other than 50%.

FIG. 4 illustrates a specific example of a how duty cycle variations cause period errors in the multiplied clock signal.

FIG. 5 illustrates an approach for correcting the period error by making the feedback divider count by different values for odd and even cycles of the reference clock signal.

FIG. 11B illustrates the covariance matrix and the cross correlation vector $C_{ex}$ used in the adaptation loop.

The use of the same reference symbols in different drawings indicates similar or identical items.

DETAILED DESCRIPTION

Figure 2:
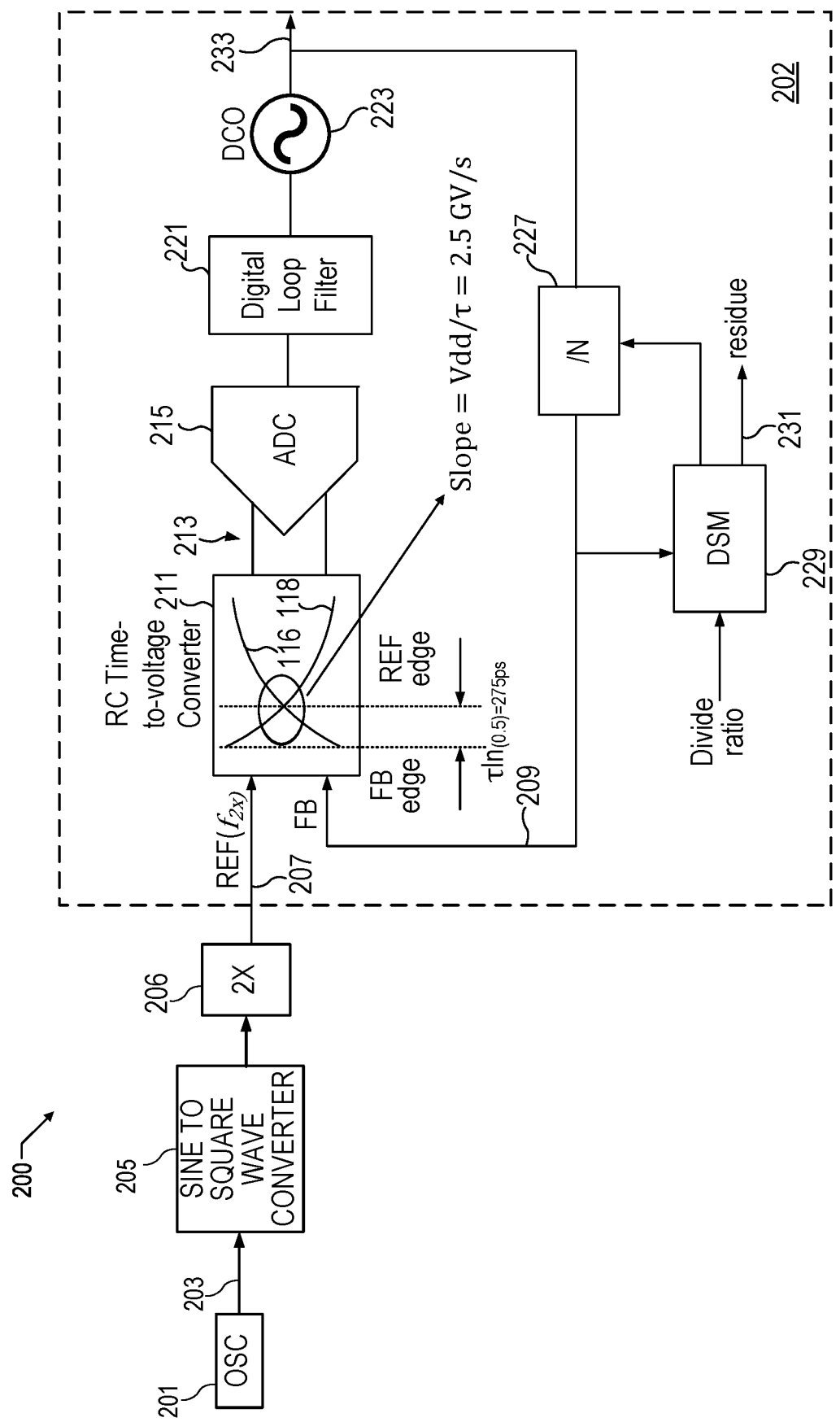
FIG. 2 illustrates a block diagram of an example system that improves the low frequency noise performance of a sine to square wave converter for a reference oscillator by using a clock multiplier circuit in the reference clock path.

FIG. 2 illustrates an exemplary block diagram of a system 200 that improves the low frequency noise performance of a sine to square wave converter for a reference oscillator by using a clock multiplier circuit in the reference clock path. An oscillator 201, e.g., a crystal oscillator (XO) or voltage controlled crystal oscillator (VCXO), supplies a sine wave 203 to the sine to square wave converter 205. The sine to square wave converter 205 supplies a reference clock signal to a clock multiplier circuit 206 that doubles the frequency of the square wave. The system 200 includes a phase-locked loop 202 having a high gain RC based time-to-voltage converter 211 that supplies a differential voltage 213 to an analog to digital converter (ADC) 215. The time-to-voltage converter 211 (also referred to herein as a phase detector) converts the phase difference between the reference clock signal (REF) 207 and the feedback signal (FB) 209 to the voltage 213. In simple terms, phase detection gain is considered to be high if a steep slope generator, with slopes greater than a few GV/s, is used as part of the phase detector. Conventional phase detectors do not use a slope generator and generate a current/voltage pulse whose width is proportional to the time difference of the two inputs of the phase detector. Consequently, these phase detectors have low gain, ($1/2\pi$) in typical applications. High gain is realized by the slopes generated while charging/discharging a capacitor through a resistor. The analog to digital converter (ADC) 215 supplies a digital value corresponding to the phase difference to digital loop filter 221, which in turn controls the digitally controlled oscillator (DCO) 223. In embodiments, the DCO includes a voltage controlled oscillator (VCO). The multi-modulus feedback divider 227 supplies the feedback clock signal 209. Delta sigma modulator (DSM) 229 controls the feedback divider 227 to achieve a fractional-N divider. Significant quantization noise, corresponding to residue 231, is associated with the DSM 229.

One approach to address the period error utilizes an analog duty cycle correction circuit to adjust the threshold of the sine to square wave converter to reduce the period error as described in U.S. patent application Ser. No. 16/670,874, entitled "Noise Canceling Technique for a Sine to Square Wave Converter", naming Aslamali R. Rafi as first inventor, filed Oct. 31, 2019, which application is incorporated herein by reference in its entirety. The goal is to ensure that the output signal 233 does not have phase noise caused by the additive noise from the reference oscillator or the sine to square wave converter.

When the reference clock signal is used in PLLs with a high gain phase detector, which has significant non-linearity, the presence of an additive spur in the reference clock signal at the input of the phase detector in reference clock signal 207 in combination with the non-linearities of the PFD, cause the mixing of quantization noise with the spur which degrades the system performance. One approach to reducing the impact of additive spurs in the reference clock is described in the application Ser. No. 16/805,336, entitled "Spur and Quantization Noise Cancellation for PLLs with Non-Linear Phase Detection," naming Aslamali A. Rafi et al. as inventors, filed Feb. 28, 2020, which application is incorporated herein by reference.

Figure 1:
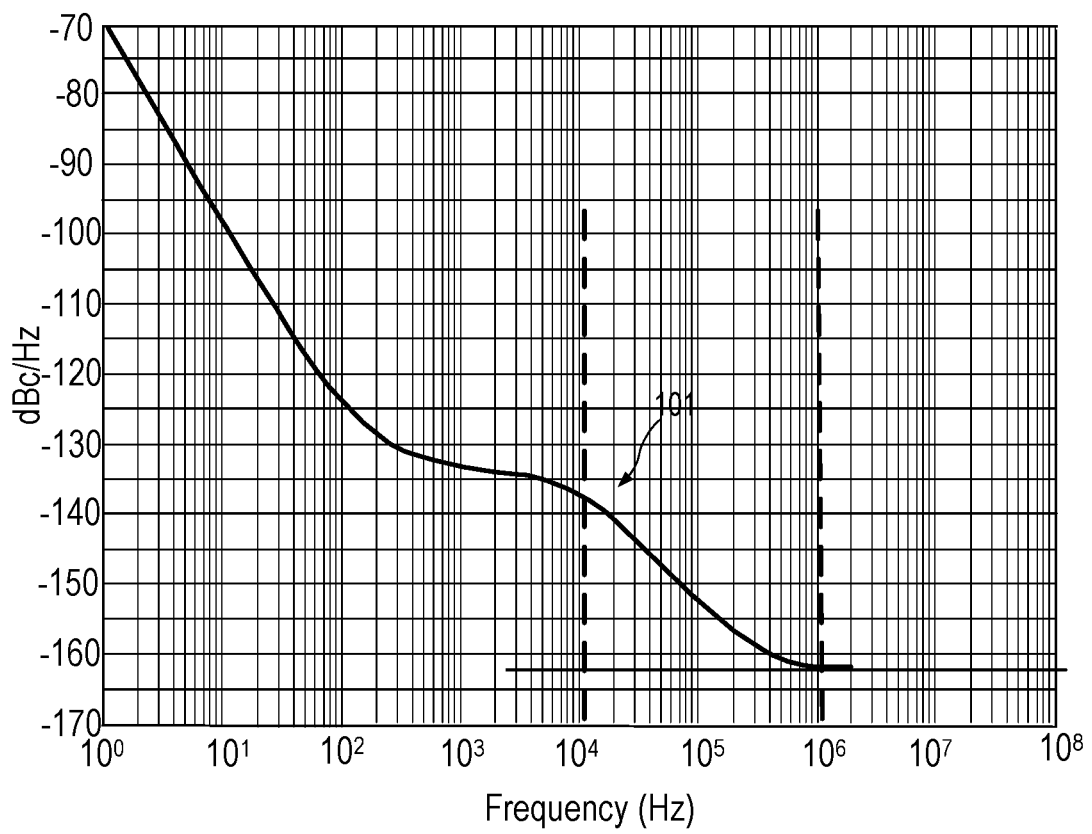
FIG. 1 illustrates the effect of additive noise in the reference clock on the phase noise profile of an example frequency synthesizer.

However, there are use cases when the PLL needs to work with an external crystal oscillator (XO) or a voltage-controlled crystal oscillator circuit (VCXO) that outputs a sharp rising waveform. The sharp rising waveform of the XO or VCXO might still suffer from the bias noise described in U.S. patent application Ser. No. 16/670,874, entitled "Noise Canceling Technique for a Sine to Square Wave Converter" and have a hump in its phase noise profile as shown in FIG. 1 (which can be removed by a subsequent 2× multiplier). However, the analog duty cycle correction described therein cannot be used due to the inability to access the sine wave coming from the XO and adjust the threshold used in generating the sharp rising waveform. Furthermore, the duty cycle of these external XOs or VCXOs can deviate significantly from the ideal 50% mark and can have values in the range of 40%-60%. That implies that there can be a significant period error in the multiplied reference clock waveform. FIG. 3 illustrates the problem caused by duty cycles that differ significantly from 50%. The timing diagram 301 shows a 1× clock with a 50% duty cycle (no period error) and the resultant 2× clock signal (having multiplied the frequency of the 1× clock signal by two), in which the odd period ($T_{odd}$) equals the even period ($T_{even}$). The timing diagram 303 shows a 1× clock with a non-50% duty cycle (with a period error) and the resultant 2× clock signal (having multiplied the frequency of the 1× clock signal by 2), in which the odd period ($T_{odd}$) does not equal the even period ($T_{even}$).

When the 2× clock signal with a significant period error is used as the reference input of a PLL that uses a high gain phase detector, the period error significantly affects the output of the VCO of the PLL. In the example embodiment of FIG. 2, the PLL uses high gain phase detector 211 having an RC time constant ($\tau$) that is a few hundred picoseconds (ps) in order to achieve excellent noise performance. In order for the PLL's phase detector to accommodate the period error of the multiplied reference clock, the gain of the phase detector would have to be reduced or in other words $\tau$ will need to be large enough to accommodate the period error in the 2× clock waveform. FIG. 4 shows a specific example 401 of a 50% duty cycle ideal f1× clock signal having a period of 20 ns. However, if the duty cycle of f1× is 45%/55% as shown at 403, the resulting period error in the multiplied clock signal f2× shown at 405 results in the repeating pattern of short periods 407 and the long period 409 (only one of which is shown). As compared to the ideal f2× waveform shown at 411, the actual wave form has a period error $t_{err}$ of 1 ns. That is the short period ends at 9 ns as compared to the ideal 10 ns, resulting in a 1 ns error. That invariably leads to much worse noise performance as the period error arising from 45%-55% duty cycle 1× clock of about 50 MHz nominal frequency is in the nano second range, whereas, $\tau$ is in the hundreds of pico seconds range. Therefore, $\tau$ will need to increase about 5-10 times to accommodate the period error in typical external references, leading to much worse noise performance of the whole PLL.

Another alternative would be to slow down the 1× waveforms (make them slowly rising as opposed to sharply rising) and use the analog duty cycle correction described in U.S. patent application Ser. No. 16/670,874, entitled "Noise Canceling Technique for a Sine to Square Wave Converter". However, reducing the slope of the reference clock edges also invariably leads to degraded noise performance as the slowly rising edges are significantly more susceptible to phase noise degradation.

Accordingly, embodiments described herein correct the period error in the multiplied reference clock waveform in a manner that does not require slow edges in the incoming clock or shallow slopes in the high gain phase detector. Instead, period error correction happens entirely in the digital domain. Thus, the noise penalty that occurs while correcting duty cycle error of the 1× clock is no longer a concern and superior jitter performance is achieved in the overall PLL.

FIG. 5 illustrates an approach for correcting the period error by making the feedback divider count by different values for odd and even cycles of the reference clock signal, and thereby divide by different values for odd and even cycles. As shown in FIG. 5, with the actual reference clock signal waveform 501 (f2× actual), the feedback divider signal (fb) 503 is adjusted so that the number of VCO cycles counted 505 varies according to the period error. Thus, in the example shown in FIG. 5, the feedback divider counts more VCO cycles during even periods of the reference clock signal f2× actual and fewer VCO cycles during odd periods of f2× actual. Thus, a period error is introduced into the feedback clock signal to match the period error of the reference clock signal. The phase detector would then not see any difference between the feedback clock signal and the reference clock signal due to the period error.

Figure 6:
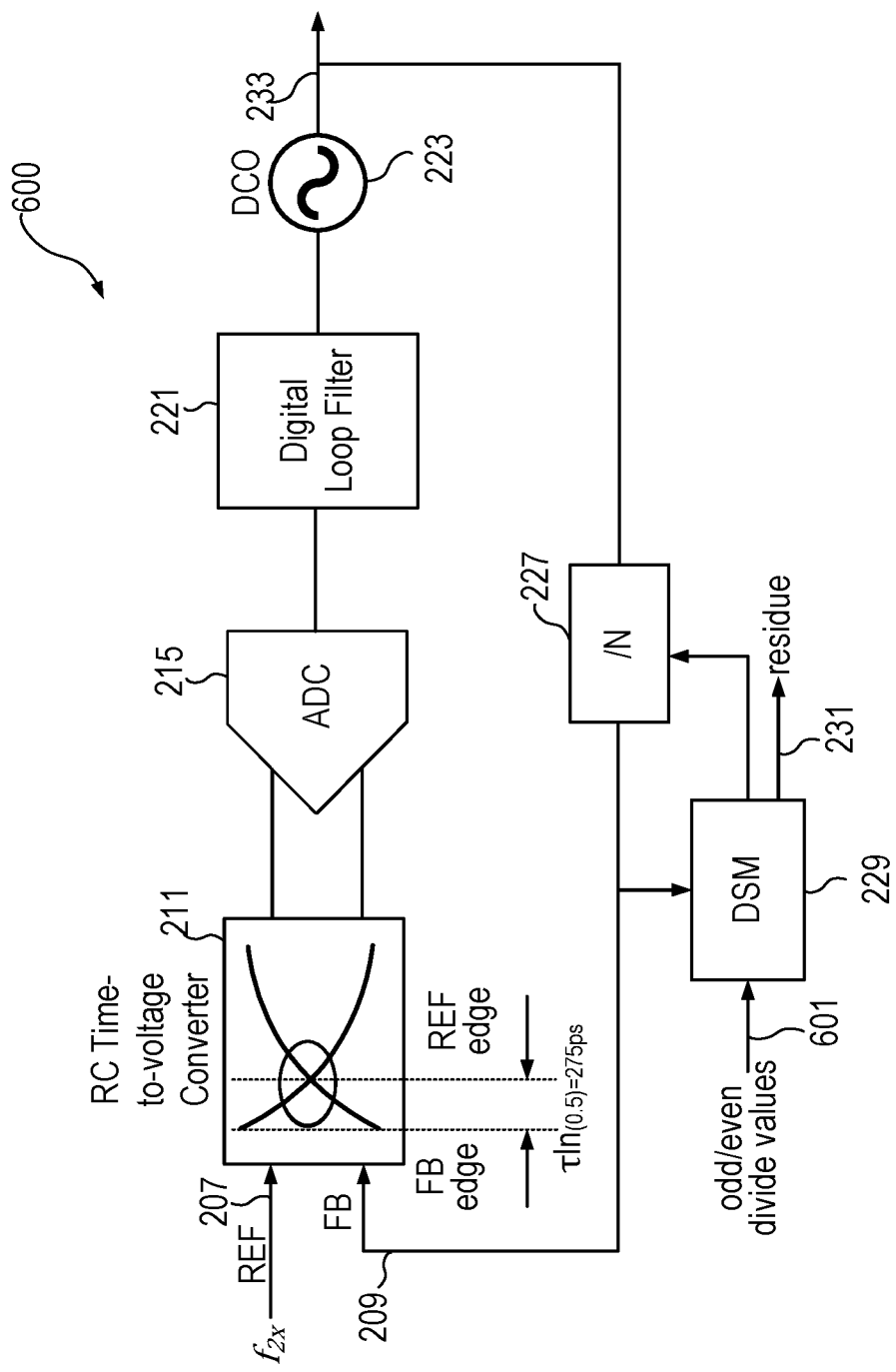
FIG. 6 illustrates a high level block diagram of a PLL embodiment that adjusts the length of the feedback clock period by supplying odd/even divide values to the delta sigma modulator coupled to the feedback divider.

FIG. 6 illustrates a high level block diagram of a PLL embodiment 600 that adjusts the feedback clock period by supplying odd/even divide values 601 to the delta sigma modulator 229. The other elements of the PLL 600 are the same as the PLL 202 shown in FIG. 2. In an embodiment, as described further herein, the odd/even division values for the feedback divider are determined adaptively using a covariance matrix approach. In one such embodiment the Gauss Seidel Algorithm for matrix inversion is used to determine the adaptation weights.

In other embodiments, other approaches determine the odd/even division values for the feedback divider to cause the feedback clock signal to have a period error that matches the period error of the reference clock signal. For example, in other embodiments, the period error of the reference clock signal is measured, e.g., by a time to digital converter, and odd/even divide values are generated based on the measured period error and on measured period values of the VCO output clock signal (or a divided down version thereof). The odd/even divide values corresponding to the odd/even periods adjust the nominal divide value of the feedback divider on a cycle by cycle basis of the reference clock signal. The odd/even periods of the reference clock signal can be periodically measured to reflect process, voltage, and temperature (PVT) changes or measured continuously through a background calibration algorithm. For example, assuming the nominal divide value of the feedback divider is N·f, where N represents an integer term and "f" a fractional term, N·f may be adjusted (lengthened and shortened in a repeating pattern) by the odd/even adjustment to match the odd/even periods of the reference clock signal.

Figure 7:
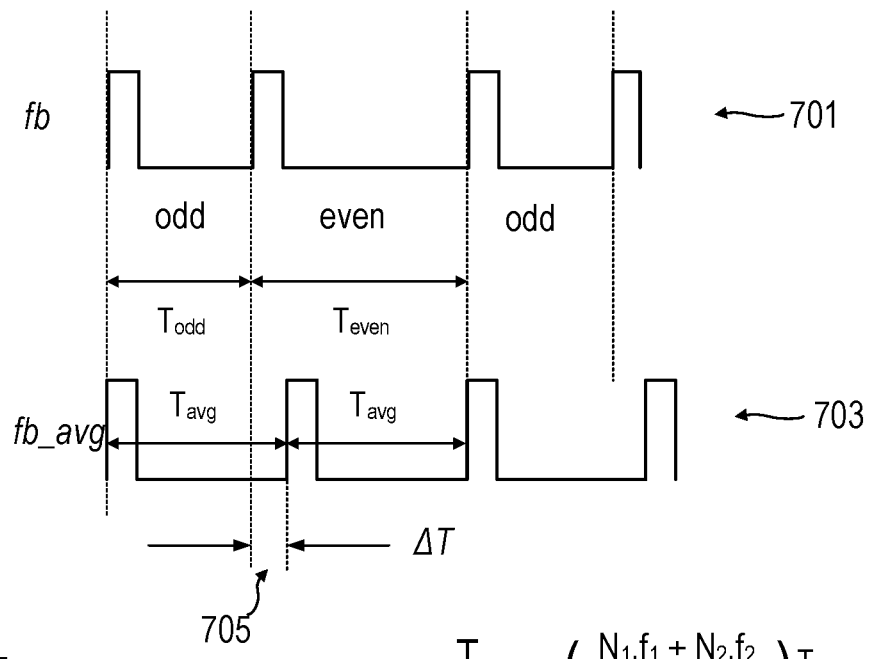
FIG. 7 illustrates how to compute the difference between the feedback clock signal that would be supplied without period length correction and the feedback clock signal with period length correction.

FIG. 7 illustrates how to compute the difference between the feedback clock signal (fb) that would be supplied without period correction and the feedback clock signal (fb) with period correction. The feedback waveform 701 shows the odd/even periods of the fb waveform that is desired in order to match the odd/even period of the reference clock signal (not shown in FIG. 7). The waveform 703 shows the result of averaging the odd/even periods of the feedback clock signal. The difference between the end of the odd period in 701 and the end of the average period in 703 is shown as $\Delta T$ 705. The period of the odd waveform $T_{odd}=T_{avg}-\Delta T$ and the period of the even waveform $T_{even}=T_{avg}+\Delta T$ The odd and even periods can also be defined in terms of the number of voltage controlled oscillator (VCO) clock cycles from the DCO 223 (see FIG. 5). Specifically, $T_{odd}=(N1·f1)\times Tvco$ and $Teven=(N2·f2)\times Tvco$, where N1·f1 is the divide value for odd cycles, N2·f2 is the divide value for the even cycles, and $T_{VCO}$ is the period of the VCO output signal 233 (see FIG. 6). The average feedback clock period shown at 703, $$T_{avg} = \left(\frac{N_1 \cdot f_1 + N_2 \cdot f_2}{2}\right) T_{VCO}.$$

The difference between $T_{avg}$ and the odd and even periods, $$\Delta T = \left(\frac{N_2 \cdot f_2 - N_1 \cdot f_1}{2}\right) T_{VCO}$$

and therefore $$\Delta T = \left(\frac{\Delta N \cdot \Delta f}{2}\right) T_{VCO},$$

where $\Delta N \Delta f$ is the value of $N_2 \cdot f_2 - N_1 \cdot f_1$. Note that the difference in integer parts need not be the integer part of the difference and same is true for fractional parts)

Figure 8:
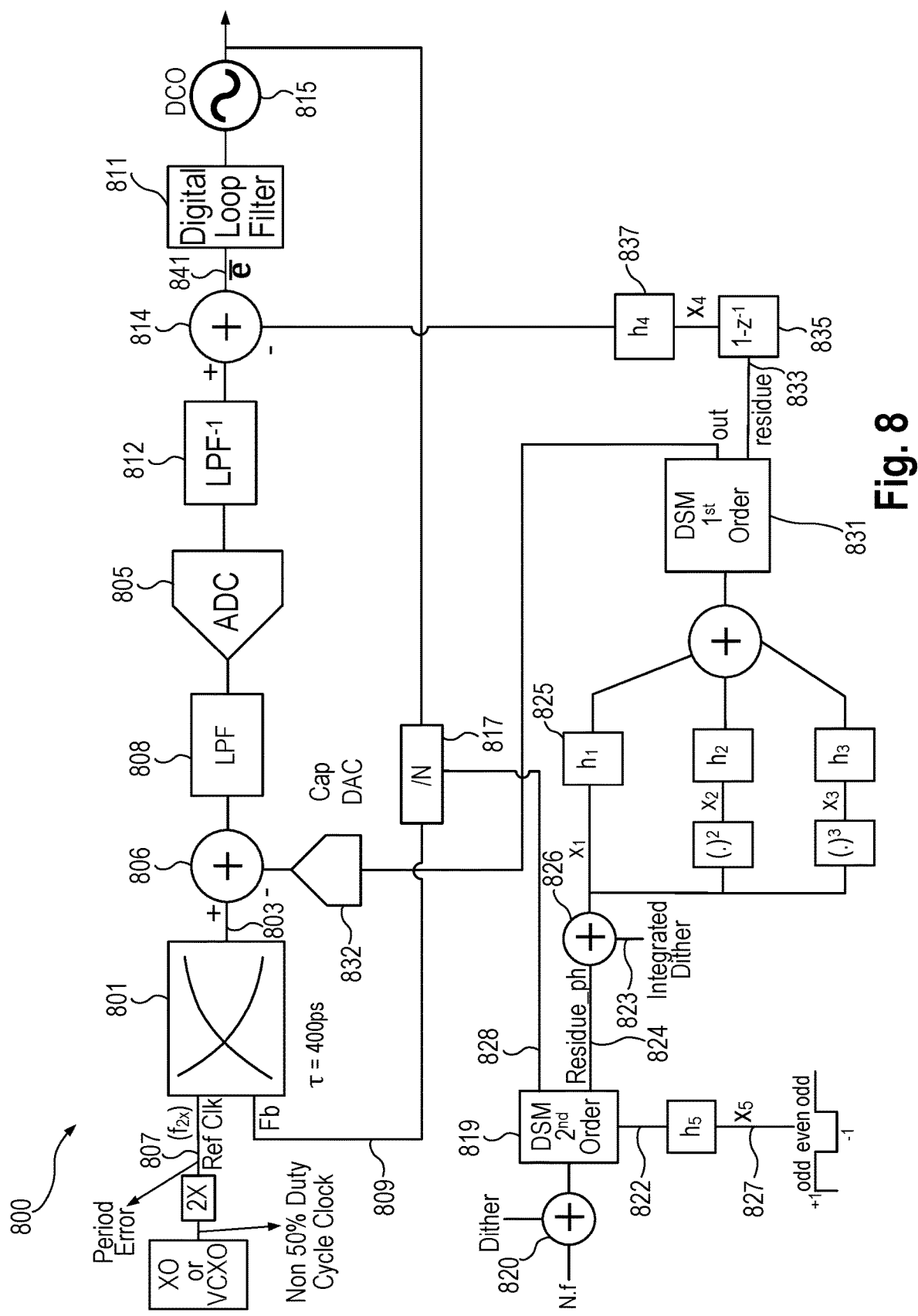
FIG. 8 illustrates an embodiment that determines the appropriate feedback divider values so that the feedback clock signal has a period error that matches the period error of the reference clock signal.

One way to find $\Delta T$ is to use an adaptive engine to determine the appropriate feedback divider values. FIG. 8 illustrates an embodiment that determines the appropriate feedback divider values so that the feedback clock signal has a period error that matches the period error of the reference clock signal. PLL 800 includes an RC time-to-voltage converter 801 that supplies a voltage 803 to an analog to digital converter (ADC) 805 through summer 806 and low pass filter 808. The time to voltage converter 801 includes a phase and frequency detector (PFD) and RC charging circuit (not shown separately in FIG. 8). The voltage 803 is an analog error signal representing the phase difference between reference clock (REF) 807 and the feedback clock (FB) 809. The low pass filter (LPF) 808 is a consequence of transferring the sampled voltage of RC phase detector into the ADC input. That is accomplished as charge transfer from the sampling capacitor of RC phase detector 801 (also referred to herein as a time-to-voltage converter) into an integrating capacitor at the input of ADC 805. That charge transfer results in a discrete time low pass filter, whose effect is cancelled out in the digital domain by the action of the inverse filter 812. The ADC 805 supplies a digital error signal corresponding to the phase difference to the inverse low pass filter 812. Summing circuit 806 receives a cancellation signal from a capacitor digital to analog converter (DAC) 823, to add or subtract a cancellation voltage to cancel the quantization noise associated with the delta sigma modulator 819. An embodiment of a capacitor DAC is described in U.S. Pat. No. 9,762,250, entitled "Cancellation of Spurious Tones Within a Phase-Locked Loop with a Time-to-Digital Converter", naming Michael H. Perrot as inventor, issued Sep. 12, 2017. In other embodiments, a different type of DAC is used to add or subtract charge to cancel the quantization noise. A second summing circuit 814 adjusts the error signal 841 being supplied to digital loop filter 811 based on the residue from delta sigma modulator 831 as explained further herein. The digital loop filter 811 controls the DCO 815 to adjust the output of the DCO to match the reference clock signal. The PLL 800 includes a fractional N feedback divider including a multi-modulus feedback divider 817 under control of delta sigma modulator 819. Delta sigma modulator (DSM) 819 receives a fractional divide value N·f (after being summed with a dither signal in summer 820) and controls the multi-modulus feedback divider 817. Significant quantization noise is associated with the delta sigma modulator 819. In addition, the delta sigma modulator receives a signal 822 indicative of the adjustment to be made to the period of the feedback divider signal.

In an embodiment the delta sigma modulator (DSM) 819 is a conventional second order DSM and provides a residue sequence that corresponds to the delta sigma quantization noise to be cancelled. The dither sequence is used by the delta sigma modulator to improve scrambling of the quantization noise. In an embodiment, the dither sequence is removed from the residue signal before determining a cancellation polynomial representing the noise to be canceled.

The accumulated dither signal 823 is subtracted from the integrated residue signal 824 (residue_ph) in summer 826 and the subtraction result $x_1$ is supplied to the coefficient block $h_1$. The residue of the delta sigma modulator is a "frequency" residue. That is because the output of the delta sigma modulator controls the instantaneous division value of the feedback divider or in other words the frequency of the divided down signal. However, at the phase detector input, the phase is determined by the sum of all the previous feedback divider values. That inherent integration implies that if the quantization noise is canceled at the phase detector output, "phase" residue should be used instead of "frequency" residue. Thus, the frequency residue is integrated to provide the phase residue (residue_ph). Note that the summers shown in FIG. 8 and the other figures herein may be additive or subtractive. A square wave indicative of the period error $x_5$ 827 is supplied to a scale block $h_5$ and $h_5 x_5$ is supplied as the error term 822, which represents for each cycle of the reference clock the appropriate $\Delta T$ value by which to adjust the period of the feedback clock signal to match the period error of the reference clock signal. The delta sigma modulator 819 generates divide values 828 for the feedback divider 817 that represents the nominal divide value N·f adjusted by the period error term 822.

The output $x_1$ of the summer 826 is combined with other terms to form a polynomial, which corresponds to the noise to be canceled corresponding to the residue of the delta sigma modulator 819 and a cancellation value based on the polynomial is supplied to delta sigma modulator 831. The output of the delta sigma modulator 831 is used to control the capacitor DAC 832, which adds or subtracts voltage to/from the analog error signal (phase difference between REF clock 807 and FB clock 809) to cancel the quantization noise. Note that the embodiment of FIG. 8 is trying to replicate what happens in the analog phase detector through digital signal processing. The non-linearity in the PLL results in quantization noise and its powers appearing at the phase detector output that is mimicked digitally through the "square" term $x_2$ and the "cube" term $x_3$ of the polynomial.

One reason for utilizing the delta sigma modulator 831 is to achieve a reasonable number, e.g., 4-6 bits for the capacitor DAC to make the capacitor DAC implementation practical. However, use of the delta sigma modulator 831 results in residual quantization noise error that also needs to be corrected. The error of the capacitor DAC cancellation can be estimated from the residue 833 of the delta sigma modulator 831 using a first order difference in block 835 and an appropriate scaling factor $h_4$ in scaling block 837. The residue error is subtracted from the digital error signal (phase difference) in summer 814 before being supplied to digital loop filter 811. For ease of illustration, the high level digital signal processing block diagram shown in FIG. 8 omits delay blocks that may be required to properly align signals.

Figures 9, 10:
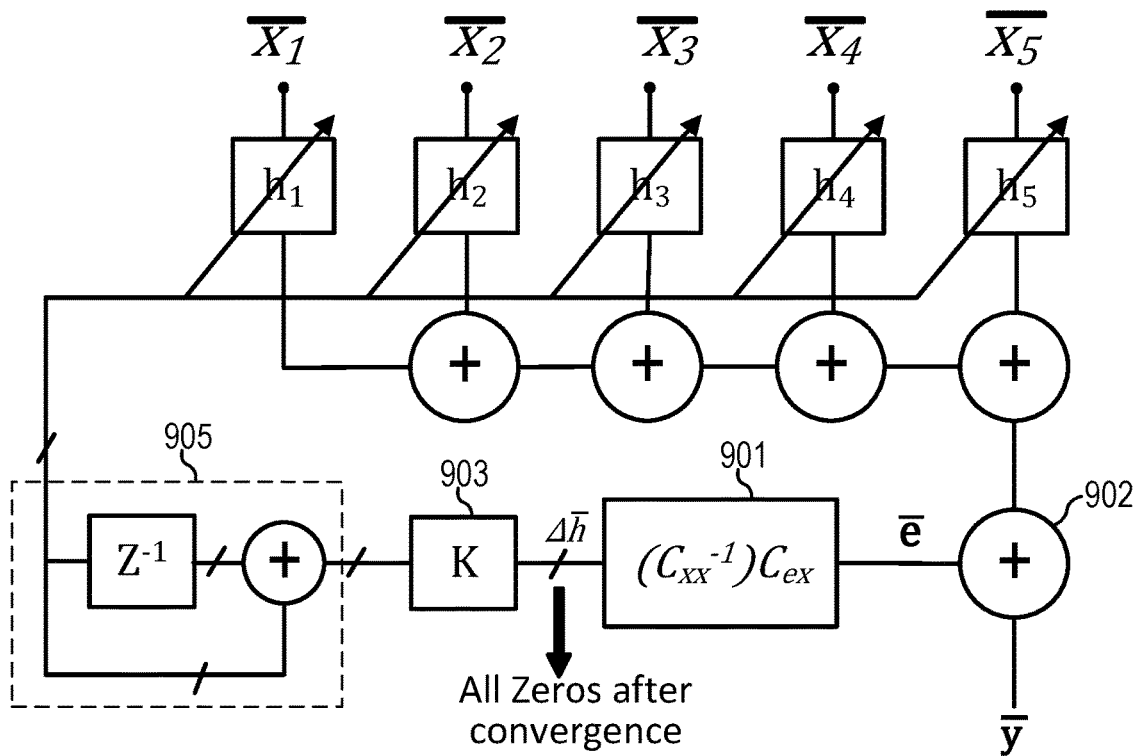
FIG. 9 illustrates the adaptation loop used to update the coefficients $h_1$-$h_5$ of the polynomial used to cancel the quantization noise, and adjust the scale factor ($h_5$) for adjusting the period of the feedback divider clock signal.
FIG. 10 illustrates the use of the Gauss Seidel Method in the adaptation loop.

The parameters of the analog time-to-voltage converter are a function of semiconductor process and temperature, whereas digital signal processing is not. Therefore, an adaptive algorithm is used to find the coefficients, $h_1$-$h_5$, so that the digital estimate of the period error and the gain and non-linearity of the time-to-voltage converter is as close to the period error and the analog gain and non-linearity as permissible. FIG. 9 illustrates an embodiment of an adaptation loop used to update the coefficients $h_1$-$h_5$. An adaptation engine to implement the adaptation loop may be implemented in hardware or software/firmware on a programmed processor such as a microcontroller or a combination of hardware and a programmed processor. $C_{xx}$ is the covariance matrix of the signals $x_1, x_2, x_3, x_4$ and $x_5$ (shown in FIG. 8) and $C_{ex}$ is cross-correlation vector of the error $\bar{e}$ with $x_1$-$x_5$, where the error $\bar{e}$ is shown at 841 in FIG. 8. $\bar{e}$, $\bar{x}_1, \bar{x}_2, \bar{x}_3, \bar{x}_4, \bar{x}_5$, are column vectors and each represents the time series values of the corresponding variable in a frame. The product of the inverse of $C_{xx}$ and $C_{ex}$ generated in 901 provides an estimate $\Delta\bar{h}$ of the deviation of the weights h from the optimum solution ($\bar{h}_{opt}$), and thus $\Delta\bar{h}=(\bar{h}-\bar{h}_{opt})$. With analog cancellation, the non linear phase error $\bar{y}$ is not available for determining the cross correlation vector $C_{ex}$. Instead, $\bar{y}$ is distributed and is present as input to the summers 806 and 814 in FIG. 8. So, in FIG. 9 the summer 902, whose input is $\bar{y}$, is actually distributed in three places in the embodiment of FIG. 8: namely, to summers 806 and 814, and the delta sigma modulator 819. The non linear phase error $\bar{y}$ is a linear combination of $x_1, x_2, x_3, x_4$, and $x_5$, where $\bar{y}=\alpha\bar{x}_1+\beta\bar{x}_2+\gamma\bar{x}_3+\delta\bar{x}_4+\epsilon\bar{x}_5$. Instead of $\bar{y}$, the error $\bar{e}$ is used to determine the deviations of $\bar{h}$ from $\bar{h}_{opt}$. The error, $\bar{e}=(h_1-\alpha)\bar{x}_1+(h_2-\beta)\bar{x}_2+(h_3-\gamma)\bar{x}_3+(h_4-\delta)\bar{x}_4+(h_5-\epsilon)\bar{x}_5$, is minimized when $\bar{h}=\bar{h}_{opt}$, where $\bar{h}_{opt}$ is a vector whose elements are $\alpha, \beta, \gamma, \delta$ and $\epsilon$. The deviation of $\bar{h}$ from $\bar{h}_{opt}$ is estimated by the product of the inverse of $C_{xx}$ and $C_{ex}$ generated in box 901. The adaptation loop acts upon this deviation of $\bar{h}$ from $\bar{h}_{opt}$ and drives this deviation to zero. That is accomplished by integrating this deviation through the accumulators 905 in FIG. 9 and letting the accumulator outputs control the h weights. The gain term K 903 in the adaptation loop is used to trade-off noise and bandwidth of the adaptation loop. The output of the accumulators will converge to the desired coefficient or weight values $h_1$-$h_5$ leading to zero correlation between $x_1$-$x_5$ and the error signal $\bar{e}$. Thus, the convergence results in the product of $C_{xx}^{-1}$ and $C_{ex}$ going to zero. The accumulated values in accumulator 905 will then maintain the correct $h_1$-$h_5$ values to effectively adjust the period of the feedback clock signal to match the period of the reference clock signal and to cancel the noise terms including the effects of non-linearity in the RC phase detector. With environmental changes such as changes in voltage or temperature, non-zero correlation will again occur and the coefficient values $h_1$-$h_5$ will be adjusted by the adaptation loop until zero correlation returns.

Figure 11A:
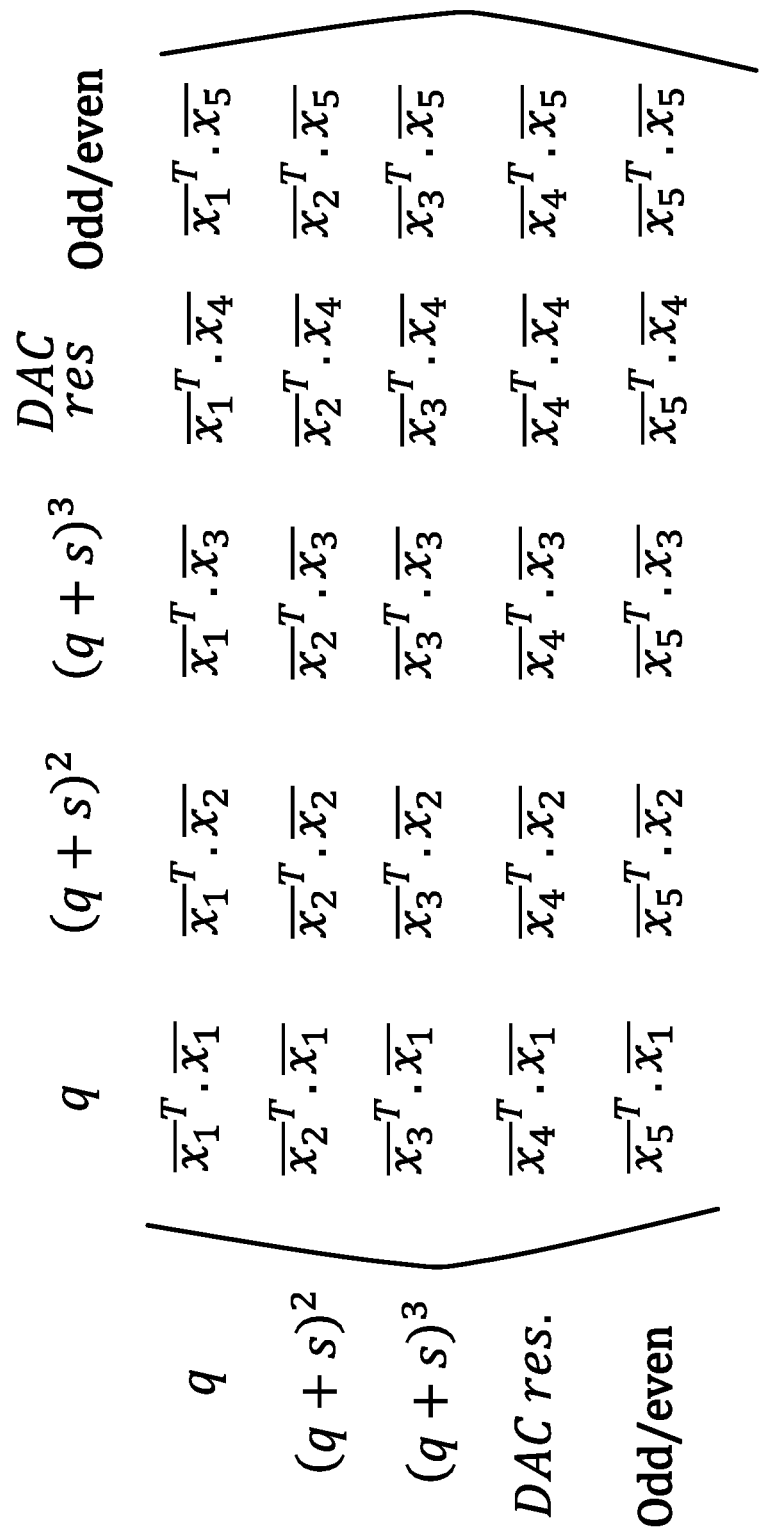
FIG. 11A illustrates the covariance matrix $C_{xx}$ used in the adaptation loop.

In an embodiment, the product of the inverse of the covariance matrix ($C_{xx}^{-1}$) with $C_{ex}$ is found iteratively through use of the Gauss Seidel algorithm. FIG. 10 illustrates solving for ($\Delta\bar{h}$), which is the deviation of $\bar{h}$ from $\bar{h}_{opt}$. The weights ($\overline{\Delta h}$) are determined by $C_{xx}^{-1}C_{ex}$ and the matrix inversion is carried out iteratively using the Gauss Seidel Method. The steps include (1) scale $C_{xx}$ and $C_{ex}$ such that $C_{xx}$ has unity diagonal; (2) split $C_{xx}$ into a unity diagonal I, a lower matrix L, and an upper matrix U as shown in FIG. 10, and (3) iterate on equation 1001. Other embodiments use an alternative algorithm to do matrix inversion, e.g., Jacobi or Gauss Elimination. FIG. 11A illustrates the covariance matrix $C_{xx}$, where q is the quantization noise. FIG. 11B illustrates the cross correlation vector $C_{ex}$ and the covariance matrix $C_{xx}$. As shown in FIG. 11B, since $C_{ex}=C_{xx}h$, $h=C_{xx}^{-1}C_{ex}$.

Adjusting the feedback divider divide ratio on even and odd edges reduces the phase difference between the feedback clock signal and the reference clock signal at the input to the phase detector in the time to digital converter (TDC). The TDC includes time to voltage converter 801, the capacitor DAC 832 and the ADC 805. In order to reduce the phase difference, the large period variation in the reference clock signal gets matched by the feedback clock signal. In embodiments, versions of the feedback clock signal get reused as the ADC clock in the ADC 805 and as the primary clock in the digital loop filter 811. In an embodiment, the gain of the ADC is proportional to the instantaneous period of the ADC clock since it counts the number of phase transitions since the last sample. That creates a mixing action between the shaped quantization noise from the capacitor DAC in the time to voltage converter, which is concentrated at high frequencies, and the period variation, which is a tone at half the clock rate. That mixing action brings some of the quantization noise into the signal band, thereby degrading overall phase noise performance of the PLL. A similar phenomenon can occur if the digital clock has the period variation that mimics the reference clock signal. At the clock domain crossing from the feedback clock domain to the higher-frequency clock, at a constant divide down from the VCO clock signal, the even and odd cycles will be held by unequal amounts of time, giving weight to one over the other in some cases. There may be other dynamic impacts of non-constant clocking schemes.

Figure 12:
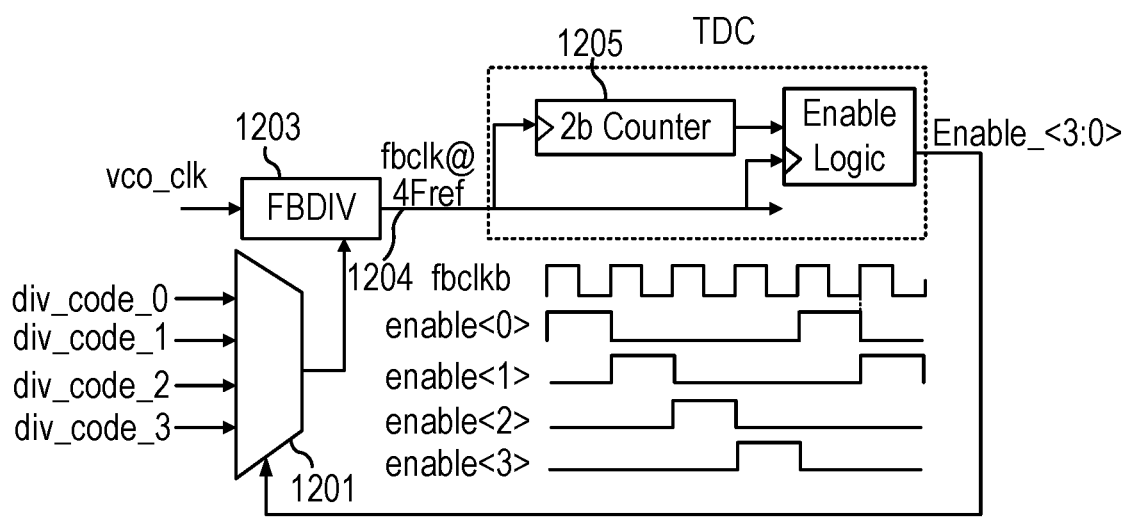
FIG. 12 illustrates an embodiment in which four separate divide ratios control the duration of four sub-phases of the feedback divider signal that is 4× the frequency of the reference clock signal.

To mitigate against such a performance degradation, the control of the feedback clock signal is adjusted to provide approximately constant periods (within the limits of a multi-modulus divider implementing a fractional divide ratio), for both the ADC clock and the digital clock. Those particular clocks are by way of example, and other embodiments may want to use other internal clock signals with approximately constant periods. That is possible because embodiments utilize a feedback clock signal that is four times the frequency of the reference clock signal. The 4× feedback clock signal is used to generate clocks internal to the TDC for its switched-capacitor operation, phase detection, and ADC clocking. An example of a TDC that utilizes the 4× feedback clock signal can be found in U.S. Pat. No. 9,762,250, entitled "Cancellation of Spurious Tones Within a Phase-Locked Loop with a Time-to-Digital Converter", naming Michael H. Perrot as inventor, issued Sep. 12, 2017. FIG. 12 illustrates an embodiment in which there are four separate divide ratios (div_code_0, div_code_1, div_code_2, div_code_3) that control the duration of four sub-phases (enable<0>, enable<1>, enable<2>, enable<3>) of the feedback divider signal 1204. The enable logic <3:0> selects the particular divide code supplied by multiplexer 1201 to the feedback divider 1203. The feedback divider 1203 supplies the feedback clock signal 1204 with a frequency that is four times the reference clock rate. A two bit counter 1205 clocked at the 4× rate can be used to generate the divide select values and the enable signals corresponding to each phase of the four phase clock. Using the structure illustrated in FIG. 12 allows the sub-phases to be advantageously used to provide a feedback signal with a variable period that matches the reference clock signal and also provide one or more clock signals having a substantially constant period for internal use by the PLL.

Figure 13A:
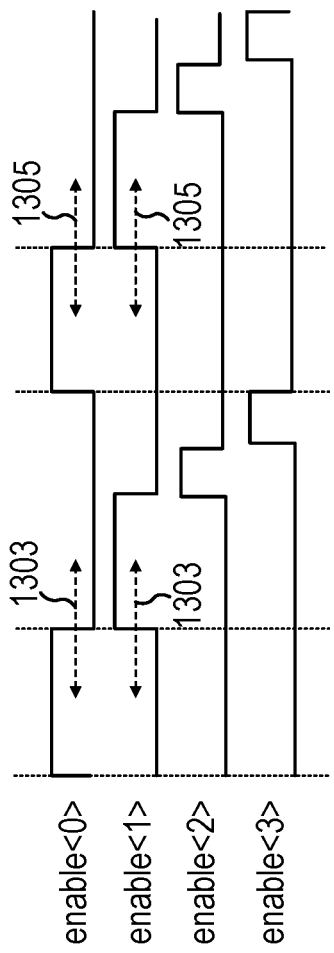
FIG. 13A illustrates that not all subphases of the feedback divider clock signal need to be adjusted to address the period error.
Figure 13B:
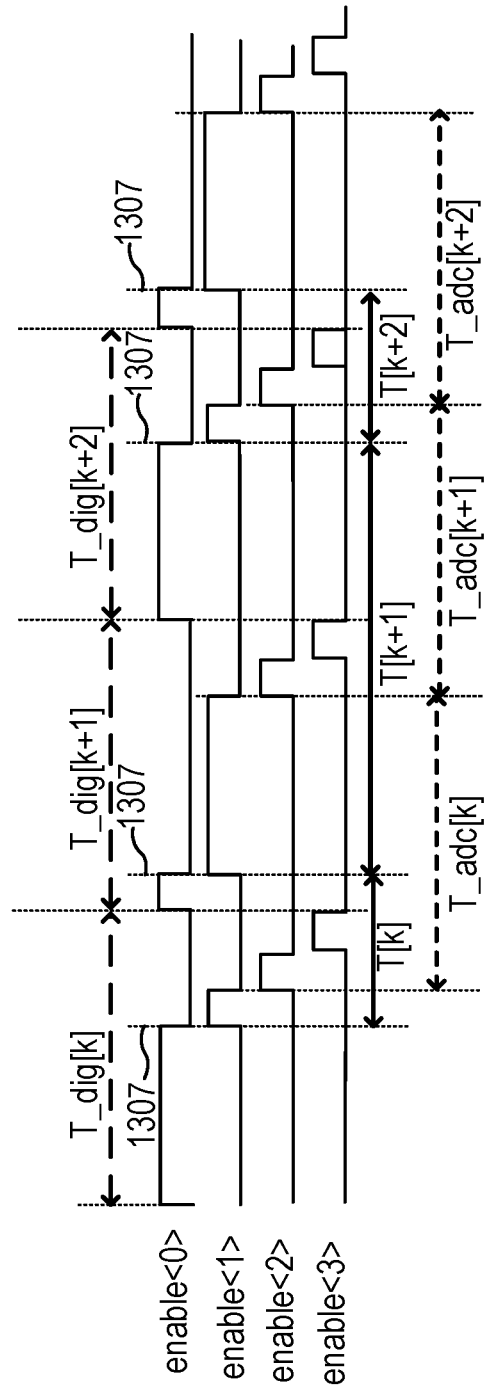
FIG. 13B illustrates that with the availability of the four sub-phases, the feedback divider clock period seen by the phase detector can be distinct from the periods of the digital clock signal for digital logic and the ADC clock signal.

FIG. 13A and FIG. 13B illustrates that with the availability of the four sub-phases, the divide period of the feedback clock signal seen by the phase detector can be distinct from the divide periods of the digital clock signal and the ADC clock signal. That allows dynamic control of the various sub-phases to keep digital and ADC clocks constant while still tracking period variation in the reference clock signal coming from the duty-cycle error in the f1x clock before doubling. That control concept is illustrated in FIGS. 13A and 13B. FIG. 13A shows the four clock sub-phases enable<0>, enable<1>, enable<2>, and enable<3> of the feedback divider signal. As indicated by the horizontal arrows at 1303 and 1305, the boundary between enable<0> and enable<1> varies to makes the length of enable<0> phase longer and the length of the enable<1> phase shorter or to make the length of enable<1> phase longer and the length of the enable<0> phase shorter depending on whether it is an odd or even cycle of the feedback clock signal. That allows the internal clocks to be generated by boundaries associated with different sub-phases thereby allowing certain internal clocks to have a substantially constant period that does not reflect the period error associated with the reference clock signal and allows the feedback clock signal seen by the phase and frequency detector to match the period error of the reference clock signal.

Referring to FIG. 13B, the periods of three clock signals are illustrated: T[k] seen by the phase detector, T_dig[k] used by the loop filter digital logic, and T_adc[k] used by the ADC. In an embodiment of FIG. 13B, only the length of enable<0> and enable<1> vary by causing the edges 1307 that corresponds to the transition from enable0 to enable1 to change on even and odd cycles, as that transition corresponds to the only edge seen at the phase detector in the TDC. The phase detector sees either the falling edge of enable<0> (or the rising edge of enable<1>) as the feedback clock signal active edge. Thus, e.g., the phase detector compares the rising edges (active edges) of enable<1> to the rising edges (active edges) of the reference clock signal. In such an embodiment, the falling edges (inactive edges) of both signals are ignored by the phase and frequency detector. By configuring the four divide ratios such that the durations of the sub-phases enable<0> and enable<1> are long enough to accommodate the expected duty-cycle-induced period variation, the duration of one of the sub-phases can be traded off against the other to keep the periods of T_adc[k] and T_dig[k] constant while still adjusting the phase detector edge and the length of the period of T[k]. Thus, a short T[k] cycle is followed by a long T[k+1] cycle, which is followed by a short T[k+2] cycle. The length of the cycle is determined by the location of the transition between enable<0> and enable<1>. In contrast, the lengths of T_dig[k], T_dig [k+1], and T_dig[k+2] are substantially constant and determined by the transition between enable<3> and enable<0>. Similarly, the lengths of T_adc[k] and T_adc [k+1], and T_adc [k+2] are substantially constant and determined by the transition between enable<1> and enable<2>.

Thus, a feedback clock signal can be generated having a period error that varies with the reference clock signal period error and other clock signals that do not track the period error that are based on the sub-phases can be used by other circuits in the PLL. Remember that the length of each sub-phase is determined by the divide value used by the feedback divider. Thus, for longer sub-phases, the feedback divider counts for a longer time corresponding to the length of the longer sub-phase before issuing an edge and for shorter sub-phases, the feedback divider counts less before issuing an edge corresponding to the edge of the short phase. In the illustrated embodiment, the lengths of the other sub-phases besides enable<0> and enable<1> remain constant.

Figure 14:
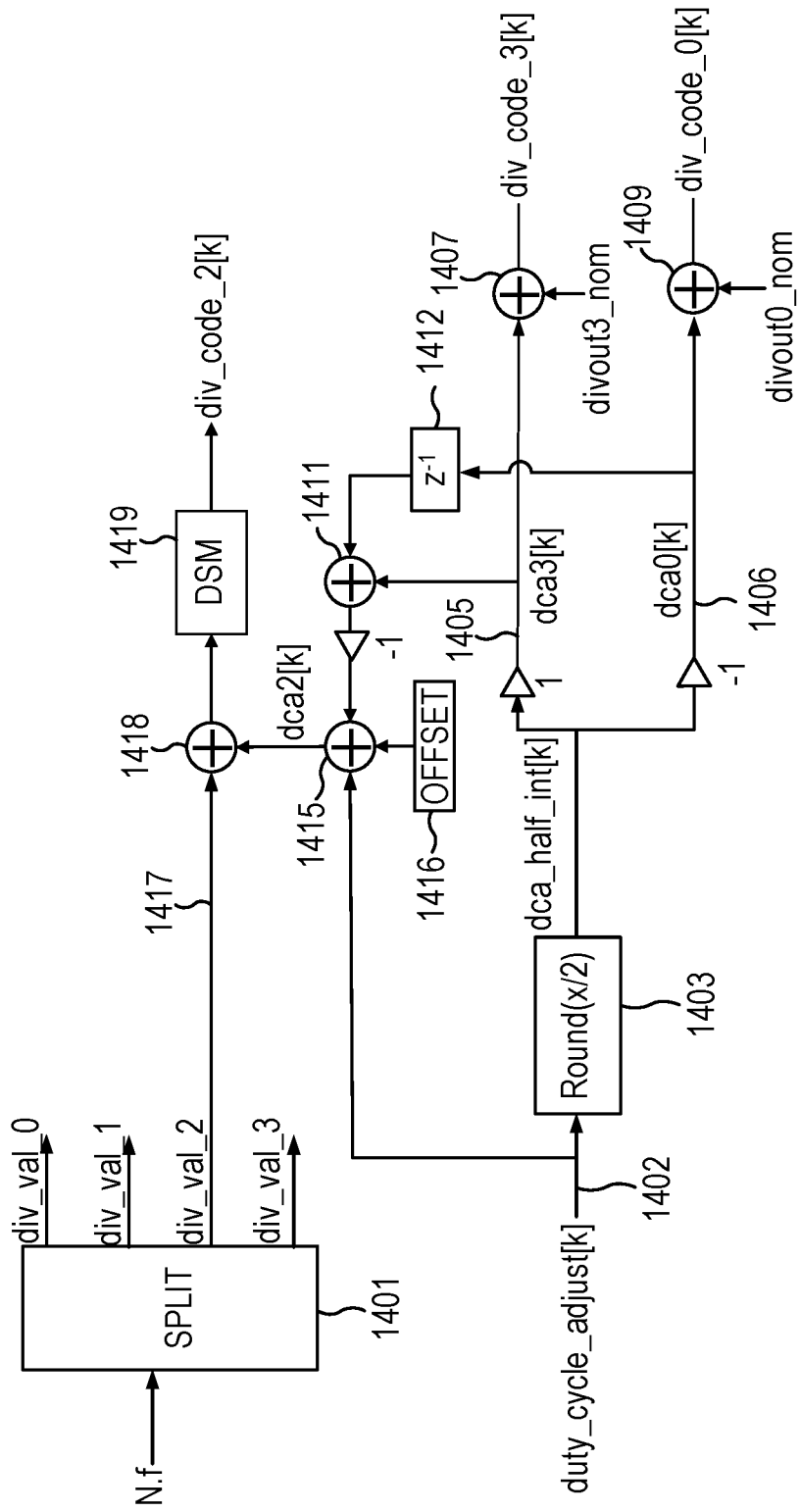
FIG. 14 shows a high level block diagram of a feedback divider control circuit to implement the timing shown in FIGS. 13A and 13B.

FIG. 14 shows a high level block diagram of a feedback divider control circuit to implement the timing shown in FIGS. 13A and 13B and provide divide values that cause the feedback clock signal to have substantially the same period error as the reference clock signal. Note that the period errors of the feedback clock signal seen by the phase and frequency detector and the reference clock signal will not be exactly the same due to limitations in circuits, rounding errors, and environmental changes. In addition, the delta sigma modulator may vary the period of the feedback clock signal to achieve a desired fractional divide value. Thus, the period error of the feedback clock signal seen by the phase and frequency detector in various embodiments described herein is substantially equal to the period error of the reference clock signal but not identical. A splitter circuit 1401 receives a nominal divide value N·f for the feedback divider and splits the nominal divide value into four divide values corresponding to four sub-phases: div_val_0, div_val_1, div_val_2, and div_val_3. The duty cycle adjust[k] signal 1402, corresponding to $h_5x_5$ (822 in FIG. 8), adjusts for even/odd period variation at the phase detector, by adjusting div_code_0[k] and div_code_3[k], which are the divider values for two sub-phases of the feedback divider clock signal. The div_code_3[k] signal controls the enable<0> sub-phase and div_code_0[k] signal controls the enable<1> sub-phase. The fourth divide ratio, div_code_1, is constant and not shown in FIG. 14. The circuit shown in FIG. 14 rounds duty cycle adjust[k] in 1403 and divides by 2 to generate dca_half_int[k]. Multiplying dca_half_int[k] by (1) generates dca3[k] and adding dca3[k] 1405 to the nominal value of divout3_nom in summer 1407 generates div_code_3[k]. Note that divout3_nom corresponds to div_val_3 from splitter 1401 adjusted by an offset and divout0_nom corresponds to div_val_0 adjusted by an offset. In an embodiment the offset and nominal values are chosen so as to make the values of div_code_2 and div_code_1 the minimum possible and allow the rest of divide ratio to be split between div_code_3 and div_code_0 for maximum range of duty cycle correction.

Multiplying dca_half_int[k] by (−1) generates dca0[k] 1406 and adding dca0[k] to the nominal value divout0_nom in summer 1409 generates div_code_0[k]. Because duty cycle adjusts[k] 1401 changes from positive to negative every cycle, div_code_3[k] and div_code_0[k] are alternately and oppositely lengthened and shortened every cycle of the reference clock signal. Summer 1415 sums the duty_cycle_adjust[k] value 1402 and offset value from offset register 1416. The two dca_half_int[k] values are combined in summer 1411 after a delay for dca0[k] in delay block 1412 to align the values so they do not cancel and then are subtracted (multiplied by (−1) and summed) in summer 1415 from duty_cycle_adjust[k] (and the offset value). That subtraction represents the duty cycle adjust value left after rounding (rounding error) and the summer 1418 combines the rounding error with the offset with the divide code div_val_2 1417. The offset sets a nominal divide ratio of div_code_2[k], e.g., to make the phase associated with div_code_2[k] shorter. In an embodiment, the offsets and nominal values are programmed such that div_code_1 (not shown in FIG. 14) and div_code_2[k] are the minimum possible, set by the maximum frequency of operation. The rest of the divide ratio is split evenly between divout0_nom and divout3_nom, for maximum duty-cycle correction range. In other embodiments div_code_2 and div_code_1, even if not minimum, are at least small enough to allow div_code_3[k] and div_code_0[k] to vary enough to reflect the period error of the reference clock signal. Note that although the feedback divider receives divider values defining the four sub-phases, in the embodiment illustrated only div_val_2, after adjusting by the offset and the rounding error, is supplied to the multi-stage noise shaping (MASH) delta sigma modulator 1419, which corresponds to the delta sigma modulator 819 in FIG. 8. In embodiments that do not need to provide the constant period for T_adc[k] and T_dig[k], only div_val_2[k] is controlled, and the input to the DSM is div_val_2[k]+duty_cycle_adjust[k]. Note that the feedback signal provided by the feedback divider is edge-aligned with the output of the VCO.

Figure 15:
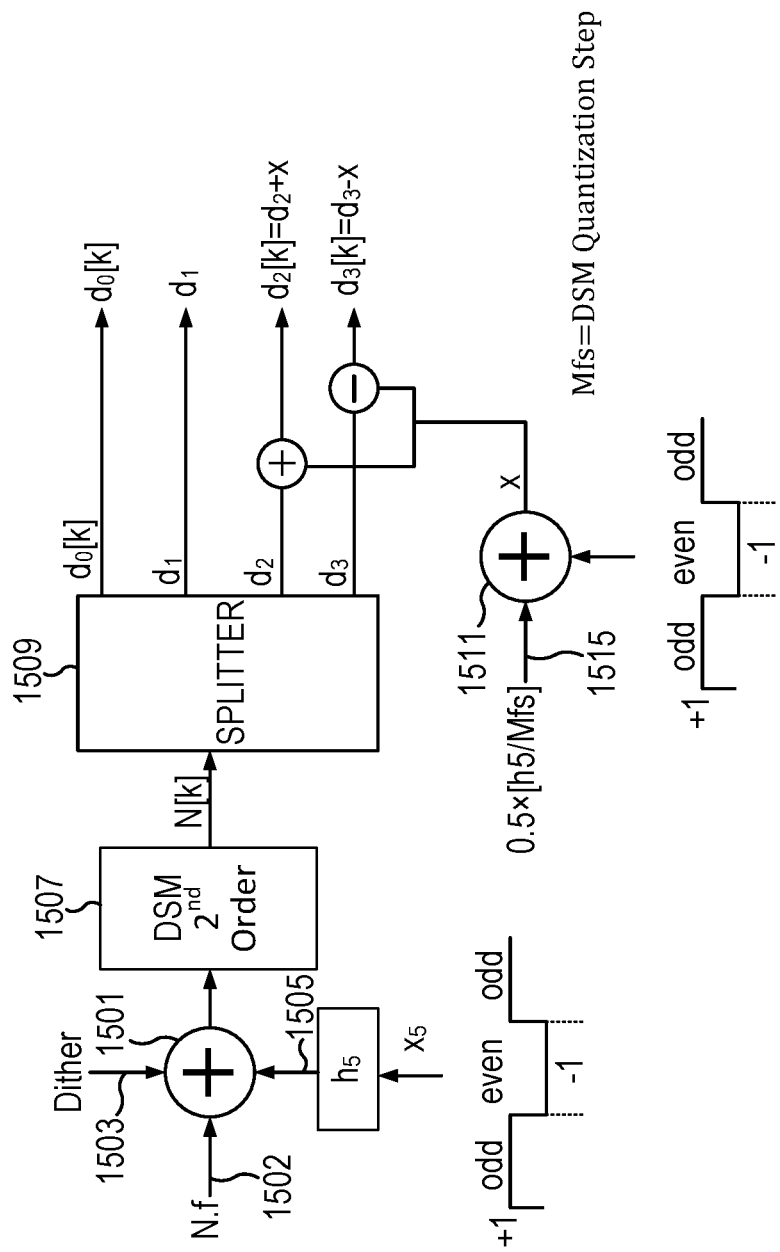
FIG. 15 illustrates another embodiment to adjust certain of the sub-phases to address the period error of the reference clock signal but not affect other clock signals in the PLL that are based on the feedback clock signal.

FIG. 15 illustrates another embodiment where the four sub-phases are generated after the delta sigma modulator. The summer 1501 combines the feedback divide value N·f 1502 with a dither signal 1503 and the phase adjust signal $h_5x_5$ 1505 and supplies the result to delta sigma modulator 1507. Splitter 1509 splits the output N[k] from the delta sigma modulator into four divider values d0[k], d1, d2, and d3, where N[k]=$d_0$[k]+$d_1$+$d_2$+$d_3$. Note that in the illustrated embodiment, d1, d2, and d3 are constant whereas d0[k] incorporates the changes made by the delta sigma modulator 1507 to achieve the fractional divide. Multiplier 1511 receives the odd/even indication 1515 (0.5×[h5/Mfs]), where Mfs is the DSM quantization step, and generates the duty cycle adjustment value "x". The values of d2 and d3 are then adjusted to represent the period error:

$$N[k]=d_0[k]+d_1+(d_2+x)+(d_3-x); k=odd.$$

$$N[k]=d_0[k]+d_1+(d_2-x)+(d_3+x); k=even.$$

That assumes the phase detector sees the boundary between sub-phases defined by divider values d2 and d3. In other embodiments, the splitter adjusts d3 and d0 (or any two sub-phases) for period error correction and incorporates the delta sigma modulator changes into d2 and/or d1 to achieve the fractional divide.

Figure 16:
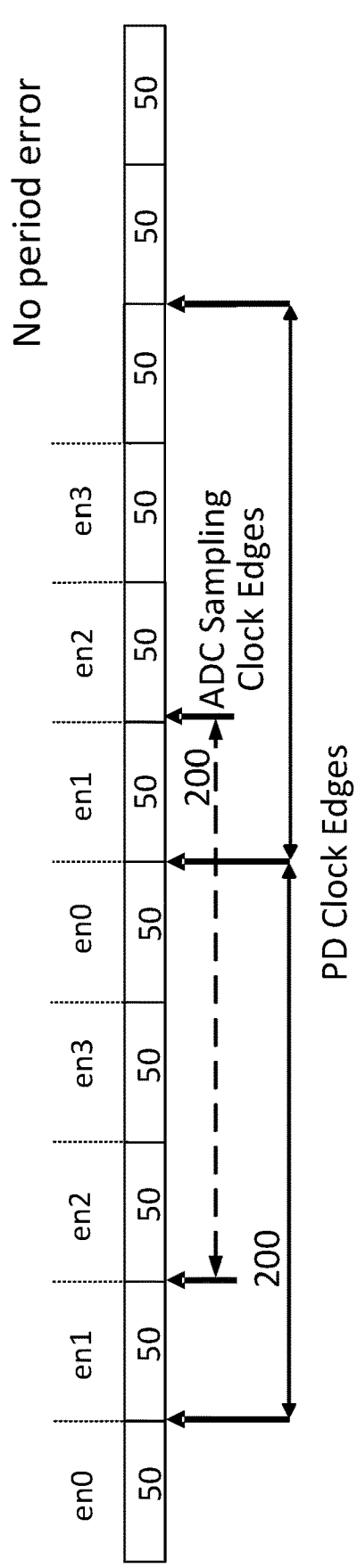
FIG. 16 illustrates a timing diagram showing no period error for a 4× feedback clock signal.
Figure 17:
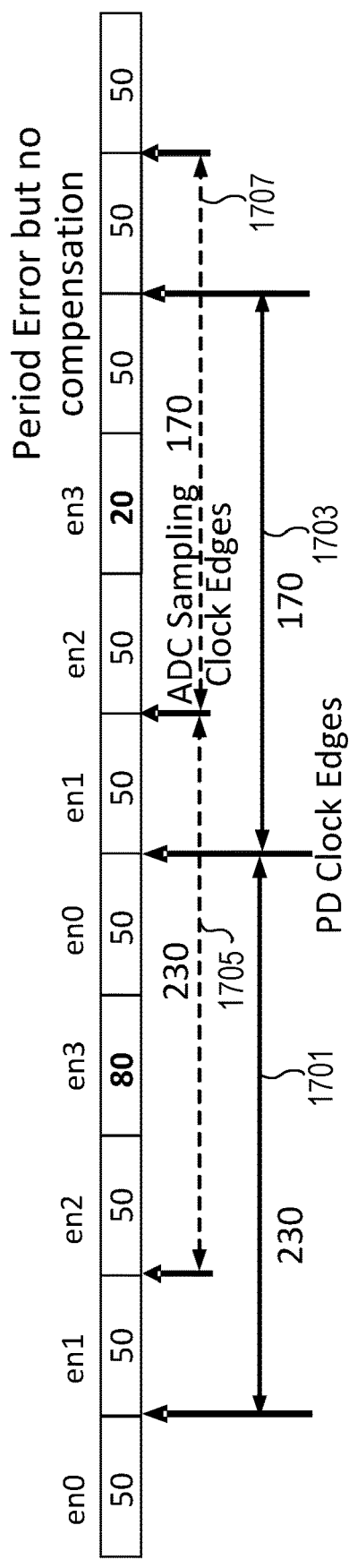
FIG. 17 shows a timing diagram showing period error but no compensation for the ADC clock signal such that the ADC clock signal has a period error.

To better understand the use of the multiphase feedback divider to correct period error, FIGS. 16-19 use example numbers. Note that FIGS. 16-19 are not drawn to scale. With reference to FIG. 16, assume the reference clock signal has an ideal 50% duty cycle. The phase detector edges see the transition between en0 and en1 as defining the feedback clock signal period and the ADC sees the transition between en1 and en2 as defining the ADC clock period. With no period error, both the ADC clock and the phase detector clocks have a period of 200 VCO periods formed by four 50 VCO periods. FIG. 17 illustrates that when the feedback clock signal is adjusted to match the period error of the reference clock signal but with no period compensation for other clocks generated by the feedback clock signal, the PD clock has a long cycle at 1701 of 230 VCO periods and a short cycle at 1703 of 170 VCO periods. With no compensation, the ADC clock also sees long and short periods of 230 VCO periods and 170 VCO periods at 1705 and 1707, respectively. The long and short periods of the ADC would cause undesirable noise in the PLL as described earlier.

Figure 18:
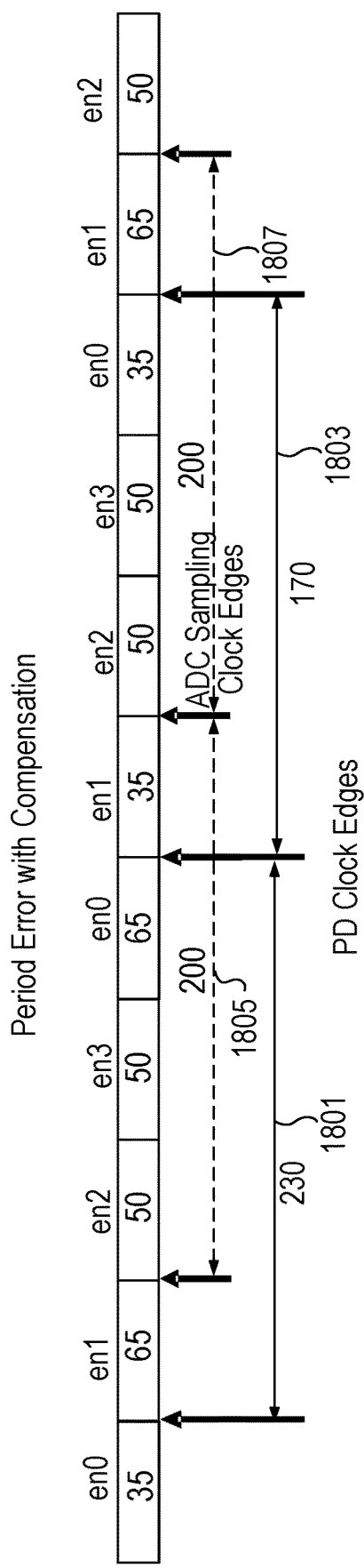
FIG. 18 shows a timing diagram illustrating how to use the four sub-phases of the 4× feedback clock signal to generate a feedback clock signal with a period error and to generate the ADC clock signal without the period error.
Figure 19:
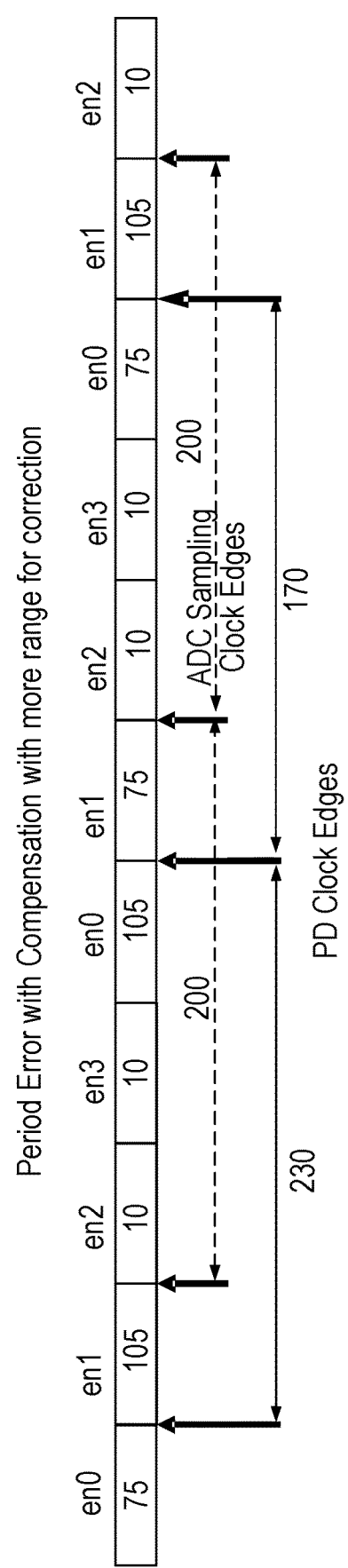
FIG. 19 shows a timing diagram illustrating how to use the four sub-phases of the 4× feedback clock signal to generate a feedback clock signal with a period error and with more range for correction and to generate the ADC clock signal without the period error.

FIG. 18 shows the results of a period compensation scheme for the ADC clock. In the embodiment of FIG. 18, the value of the period error that needs to be compensated is derived from the adaptation algorithm and changes very slowly to track period error variation across temperature (e.g., a tracking bandwidth ~20 Hz). So for the purpose of the FIGS. 17-19, the period error is assumed to be quasi-static. The phase detector clock signal has a period defined by the transition between en0 and en1. Note that en0-en3 correspond to the sub-phases enable<0> to enable<3>. The ADC clock signal has a period defined by the transitions between en1 and en2. The phase detector clock signal has a long period of 230 at 1801 and a short period of 170 at 1803. With compensation using circuits such as shown in FIGS. 14 and 15, the ADC clock maintains a 200 unit period at 1805 and 1807. FIG. 19 illustrates period error compensation with more range for correction by making the sub-phases en2 and en3 shorter than in the embodiment of FIG. 18. Specifically, en2 and en3 are only 10 units whereas en0 and en1 utilize 180 units varying between 105 and 75 in the example shown.

Figure 20:
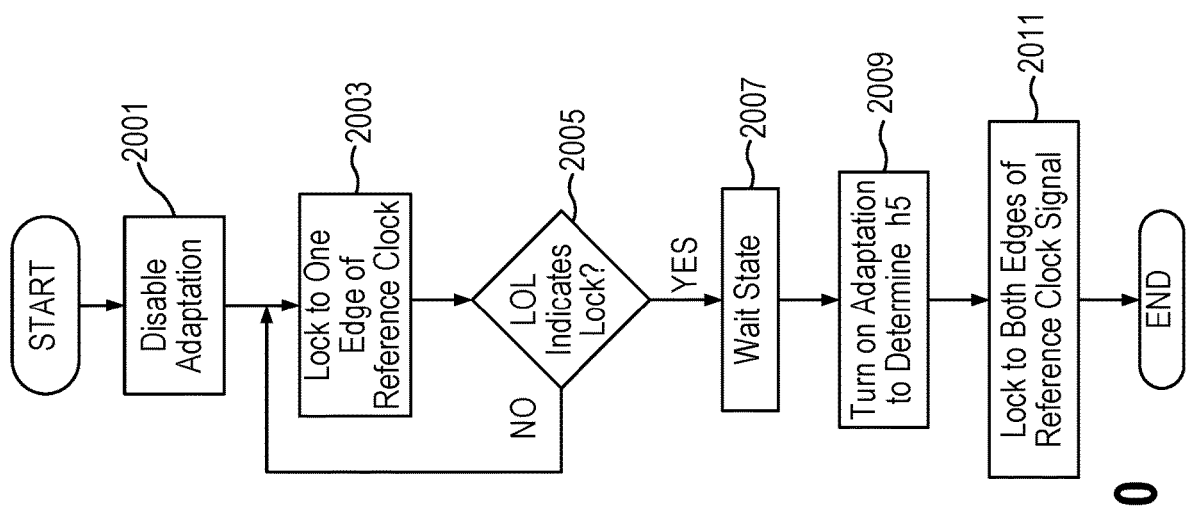
FIG. 20 illustrates a high level flow chart of a locking sequence for the PLL.

Another problem caused by large period errors happens at startup (or whenever the PLL is trying to acquire lock). In the presence of large duty-cycle-induced period variation, the PLL can have difficulty locking. To address this concern, in embodiments the PLL initially locks onto one set of edges of either even or odd cycles of the reference clock signal, to hide the period variation from the locking process by down sampling the samples supplied to the phase detector. Once lock is achieved and coarse quantization noise cancellation (QNC) adaptation is complete (in particular, h5 converges), the loop filter stops down-sampling to operate at the full rate and achieve desired performance. FIG. 20 illustrates a high level flow chart of an embodiment of the sequencing done to implement the locking sequence. At 2001 the PLL control disables the adaptation and waits in an initialization state while the PLL is configured to lock to either the odd clock edge or the even clock edge of the reference clock signal in 2003. The PLL continues to try and achieve lock until the loss-of-lock (LOL) detector indicates frequency lock is achieved in 2005. Then in 2007 the PLL enters a wait state to wait for a defined period of time, allowing for additional PLL settling. In an embodiment, once lock is achieved, and after the wait period an adaptation step provides adaptation to determine h5. During lock and the first adaptation, the phase and frequency detector and the loop filter are down sampled so only an even edge or an odd edge is observed. Note that during initial lock a coarse phase and frequency detector may be used. Once lock is achieved and the adaptation has converged, the PLL can return to locking on both edges of the reference clock signal and the adaptation loop continues to operate to update h5.

Figure 21:
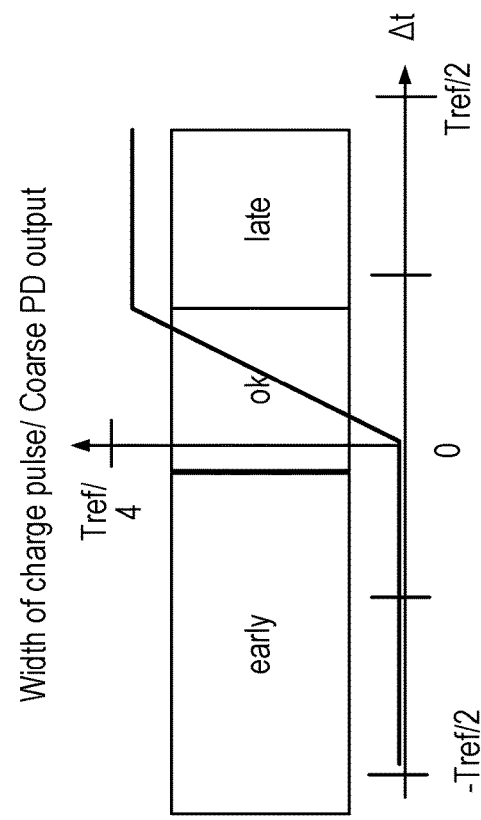
FIG. 21 illustrates an embodiment of a coarse phase detector that can be used during the locking sequence.

As shown in FIG. 21, in one embodiment a coarse phase detector essentially quantizes the reference clock signal using the 4× rate feedback divider clock signal. If the reference clock arrives during enable3 or enable0, then the reference clock signal is considered early and the TDC output reflects that the reference clock is early. If the reference clock arrives during enable2 then it is late. If it arrives during enable 1, then the reference clock signal is considered timely. The coarse frequency detector receives the down-sampled signals. Control logic associated with the coarse phase detector also looks for cases where the phase wraps around directly between early and late, thereby resulting in a larger frequency error correction when such a wrap around occurs. The down-sampling for the loop filter takes place after the quantization noise cancellation signal processing, so that adaptation can still occur based on both even and odd cycles to correct for the duty cycle, but before the control reaches the VCO. The down-sampling controls for the coarse PFD and loop filter are kept in sync so that they both look at the even edges or odd edges, but not a mismatch. In at least one embodiment, whether to lock onto the even or odd reference clock cycle is arbitrary and is not controlled.

Thus, various approaches have been described to address period error in a reference clock signal. The description of the invention set forth herein is illustrative, and is not intended to limit the scope of the invention as set forth in the following claims. Other variations and modifications of the embodiments disclosed herein, may be made based on the description set forth herein, without departing from the scope of the invention as set forth in the following claims.

What is claimed is:

1. A method comprising:
supplying a reference clock signal with a period error and a feedback clock signal to a phase and frequency detector of a phase-locked loop;
dividing a clock signal supplied to a feedback divider of the phase-locked loop by at least a first divide value during an odd cycle of the reference clock signal and by at least a second divide value during an even cycle of the reference clock signal to generate a feedback divider signal, the first divide value and the second divide value being based, at least in part, on an error term corresponding to the period error; and
generating the feedback clock signal utilizing the feedback divider signal, the feedback clock signal having a feedback period error substantially equal to the period error of the reference clock signal.

2. The method as recited in claim 1, further comprising:
dividing the clock signal in the feedback divider by a plurality of first divide values during the odd cycle of the reference clock signal and by a plurality of second divide values during the even cycle of the reference clock signal to generate the feedback divider signal, the first divide values including the first divide value and the second divide values including the second divide value;
determining two of the first divide values and two of the second divide values utilizing the error term indicative of the period error;
determining another two of the first divide values and another two of the second divide values independent of the error term;
generating a plurality of sub-phases of the feedback divider signal during odd and even cycles of the reference clock signal based on the plurality of first divide values and the plurality of second divide values; and
providing the feedback clock signal to the phase and frequency detector, an active edge of the feedback clock signal being based on a boundary between a pair of the sub-phases.

3. The method as recited in claim 2, further comprising:
adjusting lengths of two of the plurality of sub-phases of the feedback clock signal to have different lengths during the odd and even cycles of the reference clock signal.

4. The method as recited in claim 2, further comprising:
updating the error term corresponding to the period error each period of the reference clock signal,
adjusting the two of the first divide values by the error term during the odd cycle; and
adjusting the two of the second divide values by an updated error term during the even cycle.

5. The method as recited in claim 2, further comprising:
generating a system clock signal utilized by circuits within the phase-locked loop based on a boundary between another pair of the sub-phases.

6. The method as recited in claim 1, further comprising:
adjusting the error term indicative of the period error to have a zero correlation with an error signal supplied to a loop filter of the phase-locked loop.

7. The method as recited in claim further comprising:
utilized an adaptation engine to update the error term; and
wherein generating the error term utilizing the adaptation engine further includes multiplying an inverse of a covariance matrix with a cross-correlation vector, the cross-correlation vector including the error signal being supplied to the loop filter and elements of the covariance matrix, the elements of the covariance matrix being variables asscociated with respective errors in generating a control signal for an oscillator, one of the variables being associated with the error term corresponding to the period error, the one of the variables indicative of the odd and even cycles.

8. The method as recited in claim 1, further comprising:
updating the error term corresponding to the period error each period of the reference clock signal.

9. The method as recited in claim h further comprising:
the phase-locked loop locking to transitions of the reference clock signal associated with only odd cycles or only even cycles of the reference clock signal during an initial locking condition;
responsive, at least in part, to frequency lock having been achieved by the phase-locked loop to the odd cycles or to the even cycles, determining the error term indicative of the period error; and
responsive, at least in part, to the error term having converged utilized an adaptation engine, locking the phase-locked loop utilized both the odd cycles and the even cycles of the reference clock signal.

10. An apparatus comprising:
a phase-locked loop including,
a phase and frequency detector coupled to receive a reference clock signal with a period error and coupled to receive a feedback clock signal, the phase and frequency detector to supply a signal indicative of a difference between the reference clock signal and the feedback clock signal;
a feedback divider to divide a clock signal that is coupled to an oscillator of the phase-locked loop and to supply a feedback divider signal;
wherein the feedback divider signal is utilized to generate the feedback clock signal supplied to the phase and frequency detector, the feedback divider coupled to receive at least a first divide value to divide the clock signal during an odd cycle of the reference clock signal and to receive at least a second divide value to divide the clock signal during an even cycle of the reference clock signal, the first divide value and the second divide value being based, at least in part, on an error term indicative of the period error of the reference clock signal; and
wherein the feedback clock signal has a feedback clock period error substantially equal to the period error of the reference clock signal as a result, at least in part, of dividing the clock signal by the first divide value during the odd cycle and by dividing the clock signal by the second divide value during the even cycle.

11. The apparatus as recited in claim 10, further comprising:
a delta sigma modulator coupled to the feedback divider to provide at least one divide value to the feedback divider that varies to achieve a fractional divide.

12. The apparatus as recited in claim 10, further comprising:
an adaptation engine configured to generate the error term utilizing a covariance matrix; and
wherein the adaptation engine is configured to generate the error term by multiplying the covariance matrix, the covariance matrix having column vectors representing a time series values of corresponding variables, by an inverse cross-correlation vector of an error signal being supplied to a loop filter of the phase-locked loop and each of the column vectors.

13. The apparatus as recited in claim 10, further comprising:
   a subphase circuit to generate a plurality of sub-phases of the feedback clock signal based, at least in part, on the first divide value and the first additional divide values during the odd cycle and by the second divide value and the second additional divide values during the even cycle;
   wherein the feedback divider is coupled to receive the first additional divide values during the odd cycle and divide the clock signal by the first divide value and the first additional divide values during the odd cycle;
   wherein the feedback divider is coupled to receive the second additional divide values during the even cycle and divide the clock signal by the second divide value and the second additional divide values during the even cycle; and
   wherein a first sub-phase of the plurality of sub-phases has a first length during the odd cycle and a second sub-phase of the plurality of sub-phases has a second length during the odd cycle, the first length being longer than the second length, and the first sub-phase has a third length during the even cycle and the second sub-phase has a fourth length during the even cycle, the third length being shorter than the fourth length.

14. The apparatus as recited in claim 13,
   wherein a transition of the feedback clock signal seen by the phase and frequency detector occurs on a boundary between a first pair of the sub-phases.

15. The apparatus as recited in claim 14,
   wherein a system clock signal utilized by circuits within the phase-locked loop has a substantially fixed period and is based on a second boundary between a second pair of the plurality of sub-phases.

16. The apparatus as recited in claim 15, wherein one of the sub-phases in the first and second pair are common.

17. The apparatus as recited in claim 10, wherein during an initial lock condition of the phase-locked loop, the phase-locked loop locks to only odd cycles or to only even cycles of the reference clock signal.

18. The apparatus as recited in claim 10, wherein the error term is updated each period of the reference clock signal.

19. A phase-locked loop comprising:
   a phase and frequency detector coupled to receive a reference clock signal with a period error and coupled to receive a feedback clock signal, the phase and frequency detector to supply a signal indicative of a difference between the reference clock signal and the feedback clock signal;
   a feedback divider circuit to divide a clock signal that is coupled to an oscillator and to provide a feedback divider signal;
   a feedback divider control circuit to supply the feedback divider circuit at least a first divide value during an odd cycle of the reference clock signal and to supply at least a second divide value during an even cycle of the reference clock signal to cause the feedback divider circuit to provide the feedback divider signal, the first divide value and the second divide value being based, at least in part, on an error term indicative of the period error;
   the feedback divider control circuit including a delta sigma modulator coupled to provide at least one divide signal to the feedback divider circuit to achieve a fractional divide value of the clock signal; and
   wherein the feedback clock signal is based on the feedback divider signal and has a feedback period error substantially equal to the period error of the reference clock signal.

20. The phase-locked loop as recited in claim 19, further comprising an adaptation engine configured to generate the error term utilizing a covariance matrix.

21. The phase-locked loop as recited in claim 19, further comprising:
   a sub-phase circuit to generate a plurality of sub-phases of the feedback divider signal; and
   wherein respective lengths of two of the sub-phases change each period of the reference clock signal in response to the error term indicative of the period error; and
   wherein an active edge of the feedback clock signal is based on a boundary between the two of the sub-phases.

* * * * *

UNITED STATES PATENT AND TRADEMARK OFFICE
CERTIFICATE OF CORRECTION

| | |
|---|---|
| PATENT NO. | : 11,316,522 B2 |
| APPLICATION NO. | : 16/901814 |
| DATED | : April 26, 2022 |
| INVENTOR(S) | : Aslamali A. Rafi et al. |

It is certified that error appears in the above-identified patent and that said Letters Patent is hereby corrected as shown below:

In the Claims

In Claim 7, Line 1, please replace "claim further" with --claim 6 further--;
In Claim 7, Line 2, please replace "utilized" with --utilizing--;
In Claim 9, Line 1, please replace "claim h" with --claim 1--;
In Claim 9, Line 11, please replace "utilized" with --utilizing--;
In Claim 9, Line 12, please replace "utilized" with --utilizing--.

Signed and Sealed this
Seventh Day of June, 2022

Katherine Kelly Vidal
*Director of the United States Patent and Trademark Office*